United States Patent
Jaeger et al.

(10) Patent No.: US 6,252,388 B1
(45) Date of Patent: Jun. 26, 2001

(54) METHOD AND APPARATUS FOR MEASURING VOLTAGE USING ELECTRIC FIELD SENSORS

(75) Inventors: Nicolas August Fleming Jaeger; Farnoosh Rahmatian; Patrick Pablo Chavez, all of Vancouver; Sudhakar Ellapragada Cherukupalli, Delta; Gregory Samuel Polovick, Maple Ridge, all of (CA)

(73) Assignee: NxtPhase Corporation, Vancouver (CA)

( * ) Notice: Subject to any disclaimer, the term of this patent is extended or adjusted under 35 U.S.C. 154(b) by 0 days.

(21) Appl. No.: 09/204,507

(22) Filed: Dec. 4, 1998

(51) Int. Cl.$^7$ .................................................. G01R 31/00
(52) U.S. Cl. ............................................. 324/96; 324/72
(58) Field of Search ............................... 324/72, 72.5, 96, 324/144

(56) References Cited

U.S. PATENT DOCUMENTS

| | | | |
|---|---|---|---|
| 3,675,125 | * 7/1972 | Jaecklin | .................. 324/96 |
| 4,477,723 | 10/1984 | Carome et al. . | |
| 4,524,322 | 6/1985 | Bobb . | |
| 4,595,876 | 6/1986 | Kuhara et al. . | |
| 4,904,931 | 2/1990 | Miller . | |
| 4,929,830 | 5/1990 | Bohnert et al. . | |
| 4,939,447 | 7/1990 | Bohnert et al. . | |
| 5,029,273 | 7/1991 | Jaeger et al. . | |
| 5,053,693 | 10/1991 | Bohnert et al. . | |
| 5,053,694 | 10/1991 | Bohnert et al. . | |
| 5,111,135 | * 5/1992 | Kozuka et al. | .......... 324/96 |
| 5,128,608 | 7/1992 | Ochi . | |
| 5,267,336 | 11/1993 | Sriram et al. . | |
| 5,272,433 | 12/1993 | Simonelli . | |
| 5,339,026 | 8/1994 | Bohnert . | |
| 5,343,036 | 8/1994 | Bohnert . | |
| 5,475,773 | 12/1995 | Ingold . | |
| 5,477,134 | 12/1995 | Hamada . | |
| 5,559,442 | * 9/1996 | Peier et al. | .............................. 324/96 |
| 5,635,829 | 6/1997 | Hamada . | |
| 5,731,579 | 3/1998 | Woods . | |
| 5,936,395 | * 8/1999 | Kevorkian et al. | ..................... 324/96 |
| 6,016,053 | * 1/2000 | Yakymshyn et al. | .................. 324/96 |

OTHER PUBLICATIONS

"Fiber–Optic sensing of Electric field Components" by Bohnert & Nehring Applied Optics vol. 27 No. 23 Dec. 1, 1988, pp. 4814–4818.

"Fiber–optic sensing of voltage by the integration of Electric field" by Bohnert & Nehring—Optics Letters vol. 14 No. 5 Mar. 1 1989, pp. 290–292.

"Electirc field sensitive optical fibre use pie zoehetrie polymer cooling" Donalds et al.—Electronic Letters vol. 18 pp. 327–328, Apr. 1982.

"Integrated Optics Pockets Cell High–Voltage Sensor" Jaeger & Rahmation—IEEE Trans. on Power Delvery vol. 10 No. 1 Jan. 1995 pp. 127–134.

"Experience with optical instrument transforms" Schnettler et al.—proceedings of CIGRE 1998 Paris France pp. 12–104.

Jaeger et al., "Push–pull integrated–optics Mach–Zehnder interferometer with domain inversion in one branch,"Optics letters, vol. 20, No. 3, Feb. 1995, pp. 288–290.

* cited by examiner

Primary Examiner—Glenn W. Brown
(74) Attorney, Agent, or Firm—C. A. Rowley

(57) ABSTRACT

A voltage sensor for measuring the voltage on high voltage lines is formed by an electrically isolating section of dielectric material that structures the electric field generated by a voltage difference between the two ends of the isolating section and provides screening of the electric field from other electric field sources external to the isolating section. At least one electric field sensor is provided to sense the electric field in the isolating section the output(s) of which are weighted and combined to provide an accurate measurement of the voltage between the two ends. The electric field sensors are located and their outputs are combined so that error in the voltage measurement due to the influence of external electric field sources is within an acceptable range.

51 Claims, 10 Drawing Sheets

METHOD AND APPARATUS FOR MEASURING VOLTAGE USING ELECTRIC FIELD SENSORS

FIELD OF THE INVENTION

The present invention relates to a voltage sensor for measuring voltage and is particularly suitable for measuring high voltages such as on high-voltage power transmission lines.

BACKGROUND TO THE INVENTION

The list of known high-voltage voltage transducers includes inductive transformers, capacitive dividers or capacitive voltage transformers, and transducers using bulk-optic electric field sensors. The first two transducers suffer from bandwidth restrictions, expensive failure, extensive maintenance, heavy weight, and output variations. They also suffer from the need for substantial insulation that is both expensive and potentially hazardous to the environment (e.g. oil and/or $SF_6$ gas).

U.S. Pat. No. 4,939,447 issued Jul. 3, 1990 to Bohnert et al (see also the paper "Fiber-optic sensing of voltage by line integration of the electric field" Optics Letters, vol.4, no.5, Mar. 1, 1989, pp. 290–292) describe a voltage sensor that uses multiple fiber-optic piezoelectric electric field sensors to measure voltage. Accuracy is obtained by the use of a plurality of sensors i.e. the Optics Letters publication indicates that to obtain reasonable accuracy 22 sensors connected in series was required.

Pockels cells are known devices that have been used for measuring voltage particularly high voltage, for example see U.S. Pat. No. 5477134 issued to H. Hamada and U.S. Pat. No. 5731579 issued to G. K. Woods. A preferred form of Pockels cell for use in the present invention is an integrated optics Pockels cell such as that described in U.S. Pat. No. 5,029,273 issued Jul. 2, 1991 to Jaeger the disclosure of which is incorporated herein by reference.

BRIEF DESCRIPTION OF THE PRESENT INVENTION

The present invention reduces significantly the deficiencies inherent to the existing high-voltage transducer technology. The simple structure of the invention removes the need for expensive and/or environmentally unfriendly insulation; may be made lighter, allowing for less expensive transportation, installation, and maintenance; and is compatible with existing standoff structures, allowing for easy construction.

When used with compact electric field sensor technology, such as the integrated optics Pockels cell, the invention offers wide bandwidth and easy interfacing with emerging digital technology.

Broadly the invention relates to a method of measuring the value of voltage difference between two points to provide a measured value V of said voltage difference comprising measuring electric field at at least one location in space to provide a measured value of electric field E for each of said at least one location and using a mathematical combination of the value of electric field E for each of said at least one location, said combination being arranged and said at least one location being chosen so that for any given value of said voltage difference between said two points any practical disturbance in electric field influencing the measured value E does not significantly change the measured value V of said voltage difference.

Broadly the present invention also relates to a method of measuring value of voltage difference between two points to provide a value V of said voltage difference comprising choosing at least two locations spaced distances $x_i$ from one of said two points, measuring and providing values of electric fields $E_i$ at said at least two locations, applying weighting factors $\alpha_i$ to said measured electric fields $E_i$ at said corresponding positions spaced their respective distance $x_i$ from said one point to obtain a value V based on $$V = \sum_{i=1}^{n} \alpha_i E_i$$

wherein n=the number of electric field sensors and is at least 2

$x_i$ and $\alpha_i$ are selected so that $dE_i$ representing any changes in $E_i$ measured at said at least two locations spaced their respective distance $x_i$ from said one point, due to external disturbances, are compensated for so that they do not materially affect said value V, so that the value of $$\sum_{i=1}^{n} \alpha_i dE_i$$

is sufficiently small, and $x_i$ and $\alpha_i$ are obtained by a method selected from the group consisting of trial-and-error, mathematical or computer modeling.

Preferably $x_i$ and $\alpha_i$ are determined using a quadrature method or an integration formula. Preferably the quadrature method is a Gaussian quadrature.

Broadly the present invention relates to an apparatus for measuring voltage comprising an electrically isolating section between a pair of spaced conductors defining opposite ends of said isolating section between which voltage difference is to be measured, at least one electric field sensor which measures electric field at at least one location within said isolating section, said isolating section having a relative dielectric permittivity and geometry which provides sufficient screening of said at least one location from other electric field sources external to the isolating section so that said external electric field sources of practical strength do not materially change said at least one electric field measured at said at least one location.

The present invention relates to an apparatus for measuring voltage comprising an electrically isolating section between a pair of spaced conductors defining opposite ends of said isolating section between which voltage difference is to be measured, at least one electric field sensor which measures electric field at at least one location within said isolating section, said isolating section having a relative dielectric permittivity and geometry which provides sufficient screening of said at least one location from other electric field sources of practical size external to the isolating section so that the error in voltage difference measured under presence of said external sources of electric field is less than 6%.

Preferably, the error in said voltage difference measured is less than 1%, more preferably less than 0.3%.

Broadly the present invention relates to a method and apparatus for measuring voltage comprising an essentially electrically isolating section between a pair of spaced conductors between which voltage difference is to be measured.

At least one electric field sensor is positioned within the isolating section. The isolating section has a permittivity and size sufficient to provide screening of the field sensor from other electric field sources external to the isolating section so that the other electric field sources do not materially affect the voltage measurement.

Preferably the electric field sensor is an integrated optics Pockels cell.

Preferably the relative dielectric permittivity of the section is greater than 2, more preferably greater than 20.

Preferably the isolating section is a hollow isolating section in which the electric field sensor is mounted.

Preferably there is one said electric field sensor positioned in said isolating section spaced from one of the conductors a distance of between 25 and 75% of distance L between the pair of conductors.

Preferably there are a plurality of the electric field sensors positioned in the isolating section in spaced relationship along a longitudinal axis of the isolating section between the two conductors.

Preferably the number of electric field sensors in the isolating section is two, a first sensor positioned in said isolating section spaced from the one conductor by a distance of between 50 and 100% of distance L between the pair of conductors and a second electric field sensors positioned in the isolating section spaced from the one conductor by a distance of between 0 and 50% of distance L between the pair of conductors.

Preferably the number of said electric field sensors in the isolating section is three, one positioned in said isolating section spaced from the one conductor a distance of between 70 and 100% of distance L between the conductors, another electric field sensor positioned in the isolating section spaced from the one conductor by a second distance of between 30 and 70% of distance L between the pair of conductors and yet another electric field sensor positioned in the isolating section spaced from the one conductor a third distance of between 0 and 30% of distance L between the pair of conductors.

Preferably the number of sensors in the isolating section will not exceed 9.

Preferably said electric field sensors collectively occupy less than 10%, more preferably less than 2% of the distance L between the conductors.

BRIEF DESCRIPTION OF THE DRAWINGS

Further features, objects and advantages will be evident for the following detailed description taken in conjunction with the accompanying drawings in which.

DESCRIPTION OF THE PREFERRED EMBODIMENTS

Figure 1:
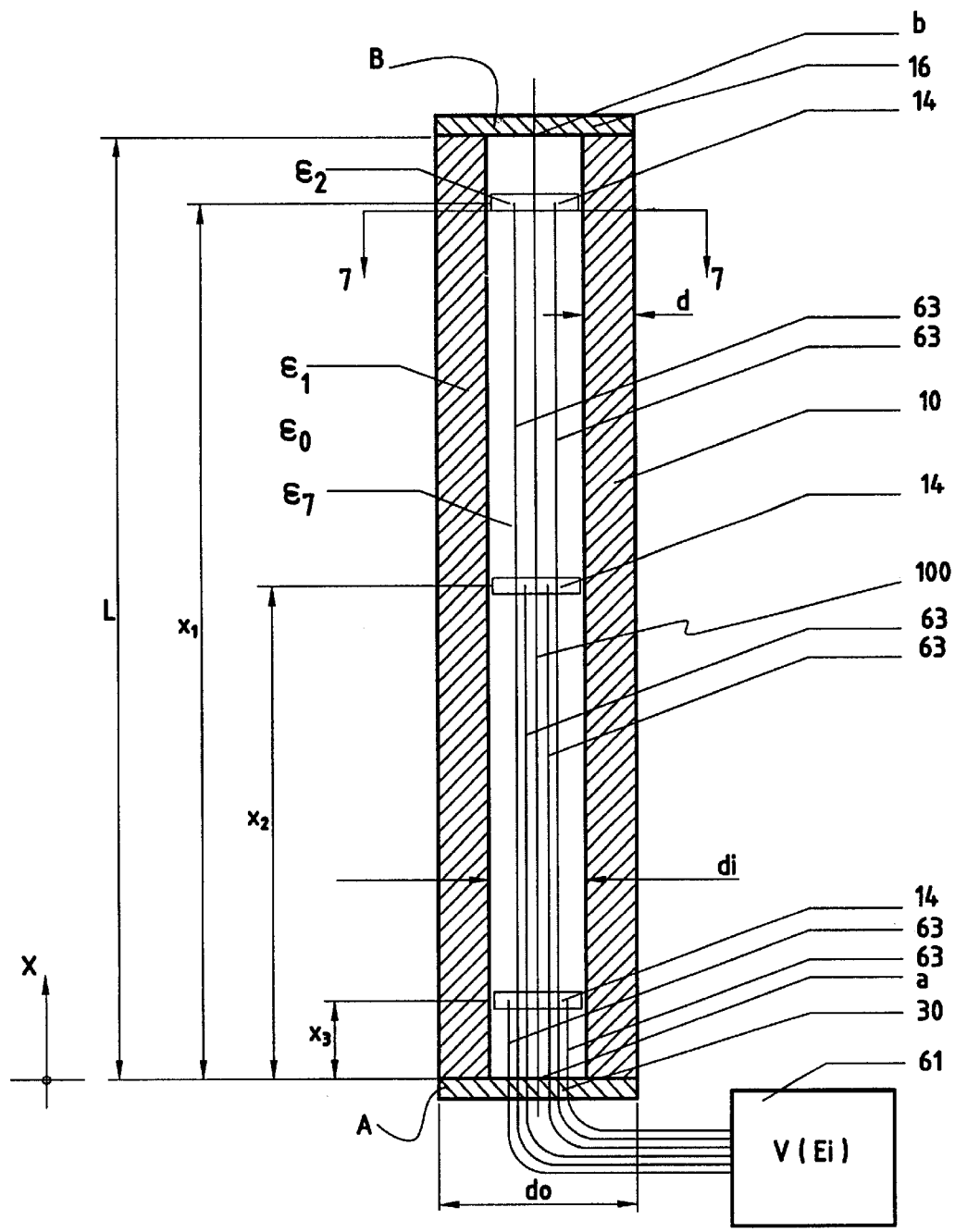
FIG. 1 illustrates the basic structure of the invention.
Figure 2:
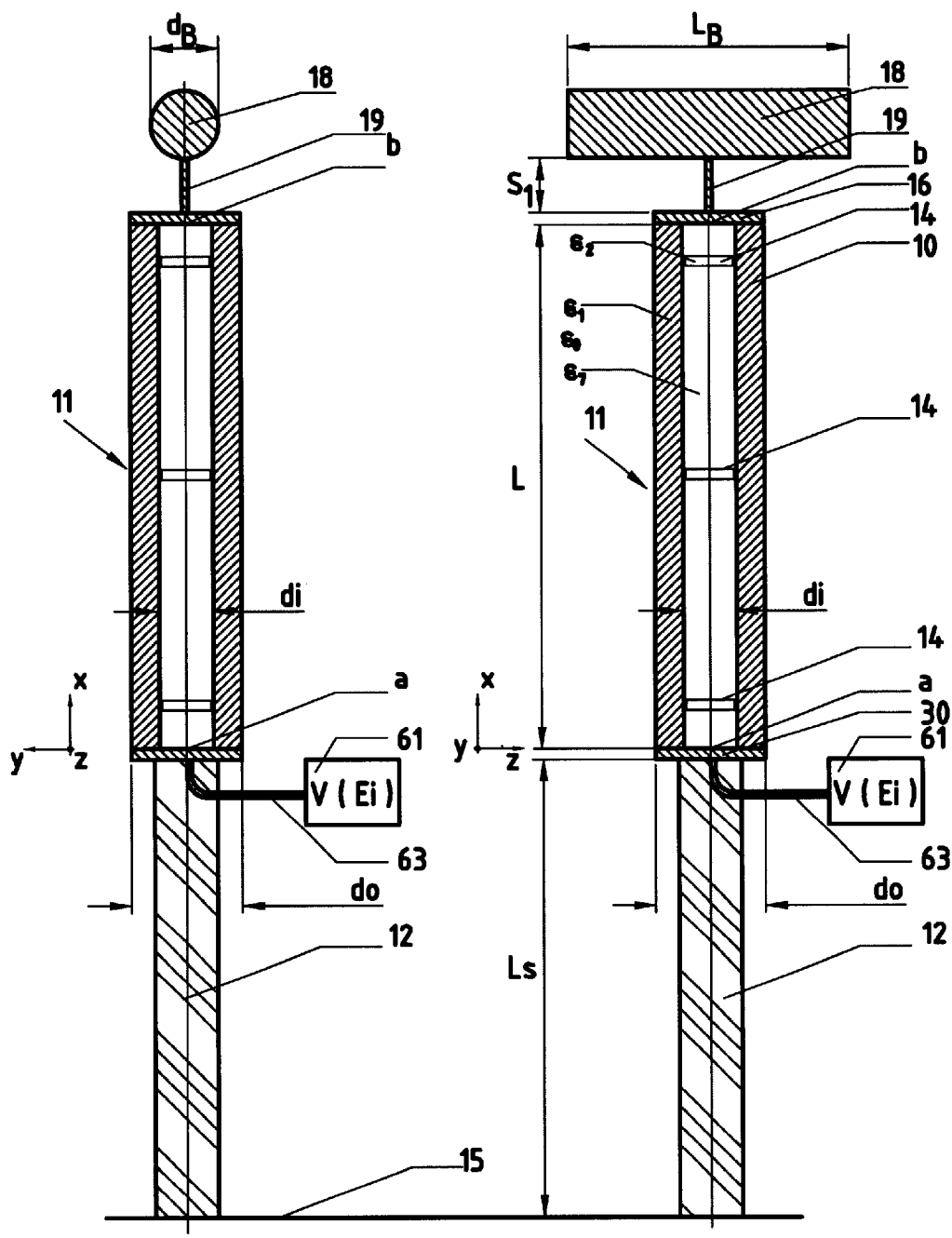
FIG. 2 illustrates a basic unperturbed Electric Field Sensor Voltage Transducer (EFS VT) structure of the present invention in front and side views as it may be installed in a high-voltage substation.

The invention as schematically shown in FIGS. 1 and 2 applied to a standoff 11 is formed by a column or isolating section 10 supported on a cylindrical metallic (current conducting) stand 12. Electric field sensors (EFS) 14 (three shown but only one is necessary and more may be used if desired) are mounted in the column 10 and are protected by the column 10 from the outside environment. The isolating section 10 is interposed between (in the illustrated arrangement of FIGS. 2, 3 and 5 ) a power line 18 and the metallic stand 12 connected to ground schematically indicated at 15 between which the voltage is to be measured. The isolating section 10 containing electric field sensors may be positioned between and connected to any two conductors between which the voltage is to be measured.

In the embodiment shown in FIG. 1 the column 10 has been shown as a hollow cylinder with an outside diameter $d_o$, an inside diameter $d_i$, and a length L. Obviously if the column 10 is not hollow, the inside diameter $d_i$ is zero (0). The thickness d of the dielectric material between the sensor 14 and the ambient surroundings in effect defines the thickness of the dielectric material shielding the sensor 14 which coupled with the permittivity of the dielectric material defines the shielding and as discussed below with respect to FIG. 6 influences the structure of the electric field.

Figure 10:
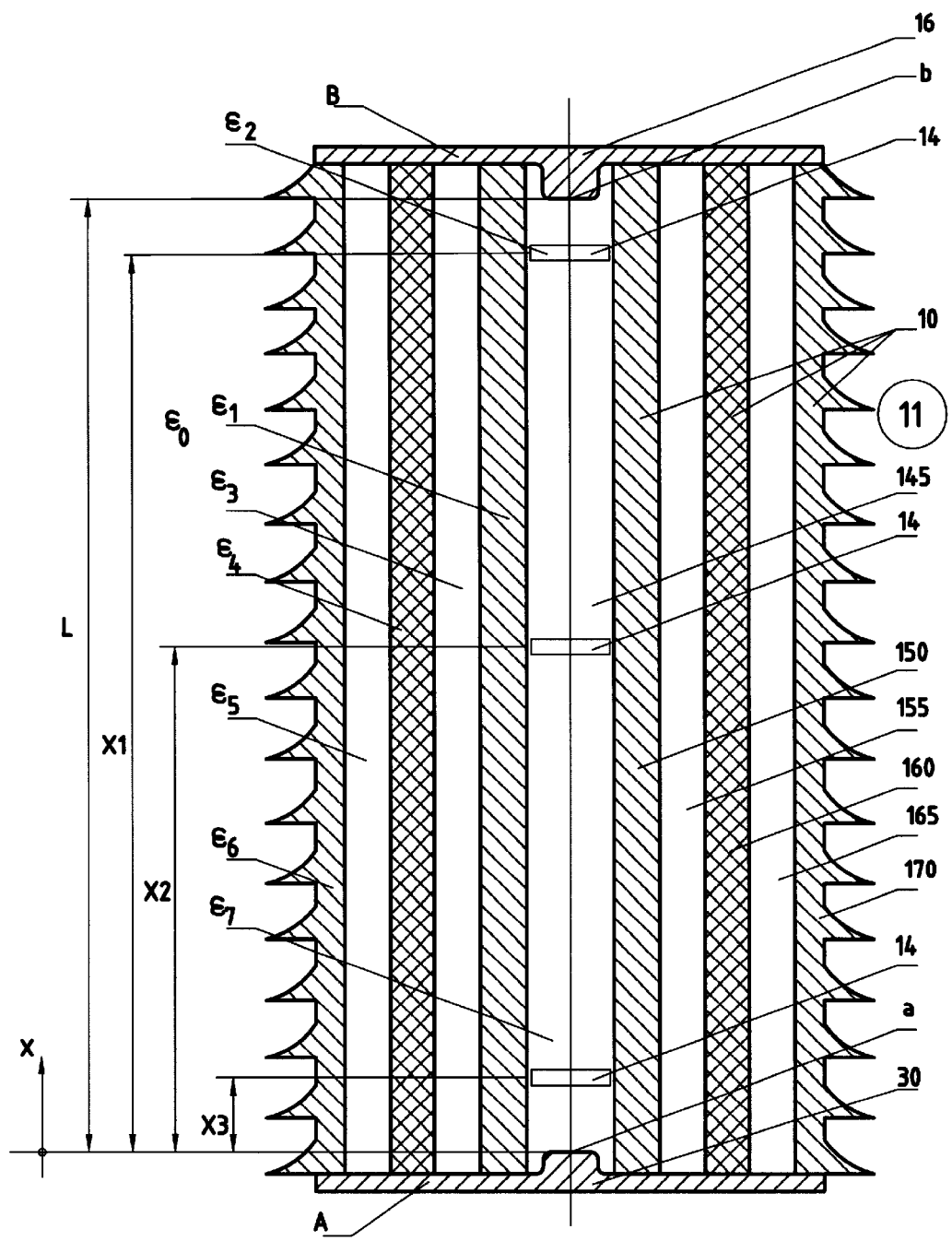
FIG. 10 is a view similar to FIG. 1 showing a modified version of the invention
Figure 11:
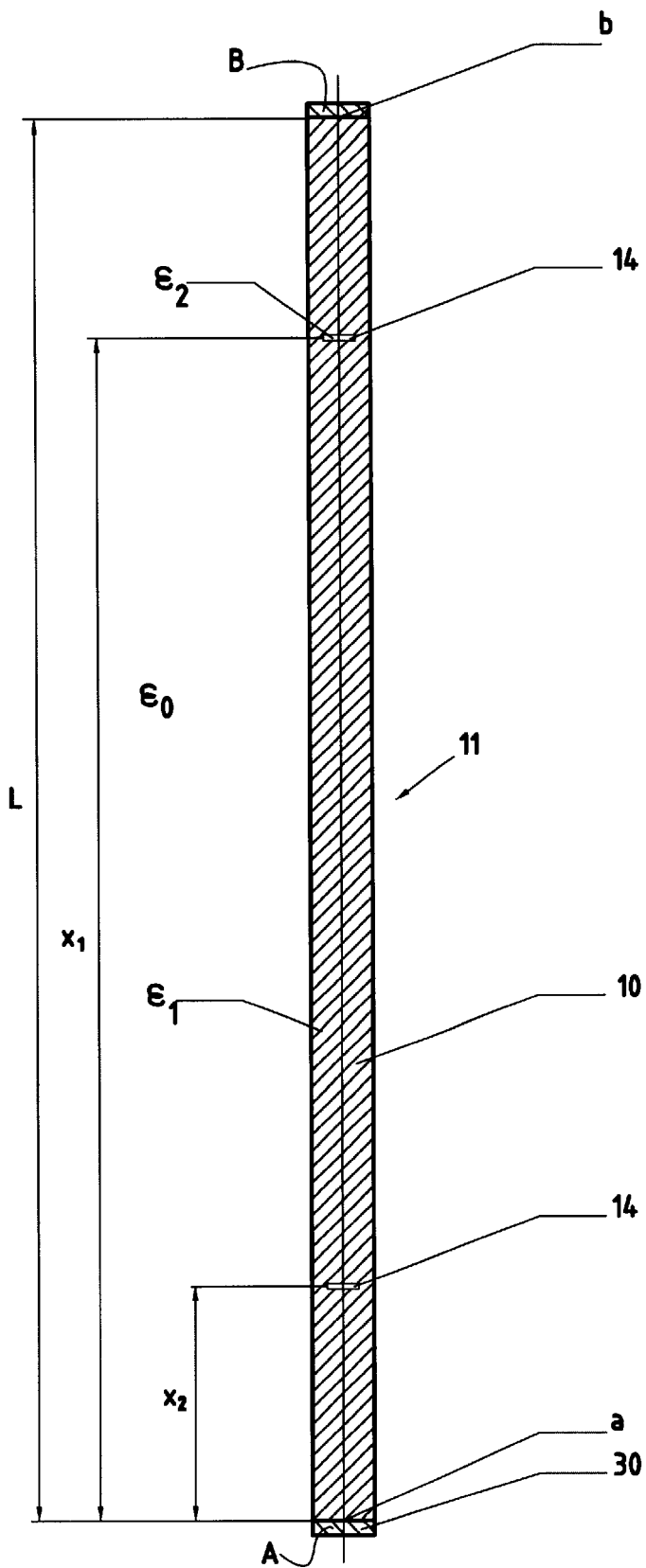
FIG. 11 shows another embodiment of the invention showing the use of a solid rod (as opposed to the hollow column) to form the isolating section.

In the FIG. 10 embodiment the isolating section 10 is formed by a laminate of a number of dielectric layers 145, 150, 155, 160, 165 and 170 (in the illustrated case, hollow cylindrical layers) that may have the same or different permittivities as indicated by the relative permittivity symbols $\in_1$, $\in_3$, $\in_4$, $\in_5$, $\in_6$, and $\in_7$. For example, the layers 145, 155 and 165 may be air. Obviously the number of layers and the permittivity of each layer or the combined permittivity of all the layers may be changed to suit the application, as desired. Preferably $\in_1$, and $\in_4$ will be greater than $\in_0$, $\in_3$, and $\in_5$. The relative permittivity $\in_0$ is the relative permittivity of the surrounding atmosphere and $\in_2$ that of the material in which the sensor is encapsulated.

It will also be noted that the outer layer 170 may be of non-uniform thickness demonstrating that the thickness of the isolating section 10 need not be uniform.

One of the simplest ways to build the isolating section 10 is to stack a plurality of discrete axial portions (measured parallel to length L) some of which termed modules will incorporate the EFS(s) and simply fix the portions and modules together to construct the section 10 with the modules containing the EFS(s) in the desired locations along the length of the section 10 i.e. the section 10 could be made of portions i.e. slices (different thickness and/or hollow) with the module(s) being slices in selected locations along the axial length of the section 10.

The length L for any installation depends on many factors the most important is safety and then accuracy. The length L should be held to a minimum for accuracy, however for safety it cannot be too short. The values (e.g. the distance from high voltage (HV) line to ground) will be chosen so that the electric field anywhere inside, near, and outside the structure is not greater than the break-down strength (field) of the material(s) present at that location under any reasonable operating condition as provided by governing bodies such as the Institute of Electrical and Electronics Engineers (IEEE), the American National Standards Institute (ANSI), the International Electro-technical Commission (IEC), and/or other local and international standards, i.e. the length L will be set to meet the required local and international standards.

Figure 6:
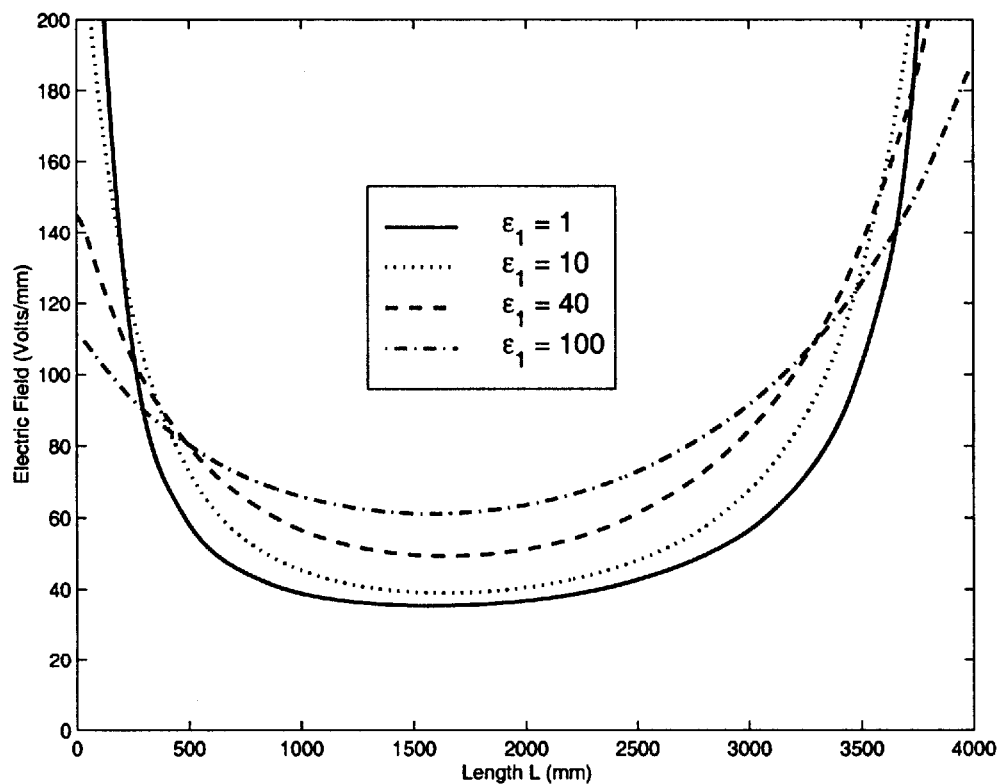
FIG. 6 is a plot illustrating the affect of relative permittivity ($\in_1$) of the dielectric shielding on electric field distribution inside the isolating section.

When a source of voltage is applied to the top 16 of the column 10 e.g. when 16 is connected to a high-voltage line 18 the dielectric material from which the section is constructed causes a structured electric field distribution in and around the column 10. As the relative permittivity ($\in_1$) of the material is increased as shown in FIG. 6 the structure of the field distribution changes i.e. the field distribution changes to be more uniform (compare $\in_1=10$ with $\in_1=100$). Though the system is operative with relative permittivity $\in_1=1$, the overall accuracy of the system improves if the permittivity is greater i.e. the field distribution is made more uniform, and external influences are reduced, thus, generally the permittivity of the section 10 will be at least 2 and preferably at least 20.

Measurement of the electric field by each of the at least one strategically placed electric field sensor 14 is delivered via lines schematically indicated at 63 (e.g. a pair of lines 63 for each sensor 14 (see FIG. 1)) to a suitable computing means 61 which may be in the form of a suitable chip or the like which as will be explained herein determines the voltage difference V between point B at one end (top 16) and point A at the opposite end of the column or section 10 (top of plate 30).

The sensors 14 are strategically placed in the isolating section 10 so as to tend to minimize error in the measurement (determination) of the voltage difference. The preferred placement of the sensor(s) can be determined by any suitable method for example by trial-and-error but the quadrature method as will be described herein below is the preferred method of determining the placement of the sensors. The end result of proper placement and selected compensation for distortions in the electric field distribution is that for the present invention typical distortions in the electric field distribution do not significantly affect the reported voltage measurement value V.

Typical causes for distortions or perturbations include the presence of other conductors at other potentials, e.g., in a high-voltage three-phase system, the presence of other two phases can be considered a cause of a perturbation. These distortions also include the effects of pollution on and around said isolating section or column 10 and its sheds, if any, and other nearby structures, conducting or non-conducting, mobile or stationary. Of course, these other structures are usually located at a distance determined using various relevant IEEE, ANSI, IEC, and/or other standards or guidelines on each voltage class.

Also, "significantly" as used in the above statement, or other words such as "materially" or "sufficiently," is defined using appropriate IEEE, ANSI, IEC, and/or other standards or guidelines available for specific applications. For example, for revenue metering in North America, VTs are typically required to have errors less than 0.3%; so, in such a case where a VT is to be used as a part of a revenue metering system, the statement "do not significantly affect the reported voltage measurement value" means that "the reported voltage measurement value is within ±0.3% of the actual voltage." Obviously, for other applications, or other standards, the terms "significantly" or "sufficiently" or "materially" correspond to other numerical values.

Another example is a VT that has to meet class 3P relaying standard according to IEC standard 60044-2 (1997-02); basically, the VT is allowed to have ±3% error in measuring the voltage magnitude and ±2° phase angle error in measuring the phase of the power frequency voltage, typically a 60 Hz or 50 Hz signal, (of course there are many other requirements in the standard and are out of the scope of this brief example); so, in this case, the statement "do not significantly affect the reported voltage measurement value" means "the reported voltage measured is within ±3% of the actual voltage and the phase angle is within ±2° of the actual phase angle;" in other words, it means that "the VT meets all class 3P accuracy requirements according to IEC standard 60044-2 (1997-02)." In general, "significant" change or error refers to a change or error that is not acceptable to the user of the equipment as far as the relevant application(s) or case(s) or requirement(s) is concerned. In other words, "sufficient accuracy" means "sufficiently small error" so that the requirements of the user on the accuracy of the device are met. Other terms used in this patent such as "do not materially change" or "sufficient screening" are to be interpreted likewise. In the high-voltage or power industry, these accuracy requirements are often recommended or set by technical authorities such as those mentioned above.

A finite number of electric field sensors (EFS) will be positioned in the isolating section 10, the total number of EFSs positioned in the isolating section 10 may, for example, be set as high as 200, but generally will not exceed 9 and normally will be less than 6.

Generally when only one electric field sensor (EFS) 14 positioned in the isolating section 10 is used (not shown) it will be spaced between 25 and 75% of distance L between the bottom plate 30 (point a) and top 16 (point b). Other locations are also possible depending on the accuracy required, but for higher accuracy the above-defined location is preferred particularly for installation in 3-phase HV substations.

Similarly when there are only two electric field sensors 14 in the isolating section 10 (not shown), a first of the two sensors positioned in said isolating section is normally spaced from one end of the isolating section 10 i.e. from plate 30 (point a) between 50 and 100% of distance L between the bottom plate 30 (point a) and top 16 (point b) and a second of the two electric field sensors 14 positioned in the isolating section 10 is normally spaced from plate 30 (point a) a distance of between 0 and 50% of distance L between said pair of conductors.

In the preferred arrangement illustrated in FIG. 1 the number of said electric field sensors 14 in the isolating section 10 is three, one positioned in said isolating section 10 spaced from plate 30 (point a) by a distance $x_1$ of between 70 and 100% of distance L between top 16 and plate 30, another sensor 14 positioned in said isolating section 10 spaced from plate 30 a distance $x_2$ of between 30 and 70% of distance L and the third of the three electric field sensors 14 positioned in said isolating section 10 spaced from plate 30 by a distance $x_3$ of between 0 and 30% of distance L.

As above indicated the precise placement of the sensors is preferably determined by a quadrature method as will be described herein below.

The preferred form of electric field sensors (EFS) are Integrated Optics Electric Field Sensors (IOEFS) more specifically Integrated Optics Pockels Cell (IOPC) electric field sensor as described in the above referred to Jaeger patent however other suitable point field sensors may be used. For example Mach-Zehnder type field sensors such as those with domain inversion in one branch (see for example N. A. F. Jaeger and L. Huang "Push-Pull Integrated-optics Mach-Zehnder Interferometer with Domain Inversion in One Branch" Optics Letters, vol. 20, no. 3, pp. 288–290, February 1995 or a sensor as described in U.S. Pat. No. 5,267,336 issued Nov. 30, 1993 to Sriram et al.) may be used, however these sensors are not as effective as the IOPC EFS referred to above.

Other examples of EFS can be found in U.S. Pat. No.: 4,929,830 "Fiber-optic electric field sensor with piezoelectric body sensor," issued May 29, 1990 to K. Bohnert, M. Kaufmann, and J. Nehring; U.S. Pat. No. 5,053,694 "Device for measuring an electric field" issued Oct. 1, 1991 to K. Bohnert and J. Nehring; U.S. Pat. No. 5,053,693 "Fibreoptical sensor" issued Oct. 1, 1991 to K. Bohnert and W. Buser; U.S. Pat. No. 5,475,773 "Fiber-optic quartz voltage sensor" issued Dec. 12, 1995 to M. Ingold; and U.S. Pat. No. 5,731,579 "Electro-optical voltage sensor head" issued Mar. 24, 1998 to G. K. Woods.

Figure 7:
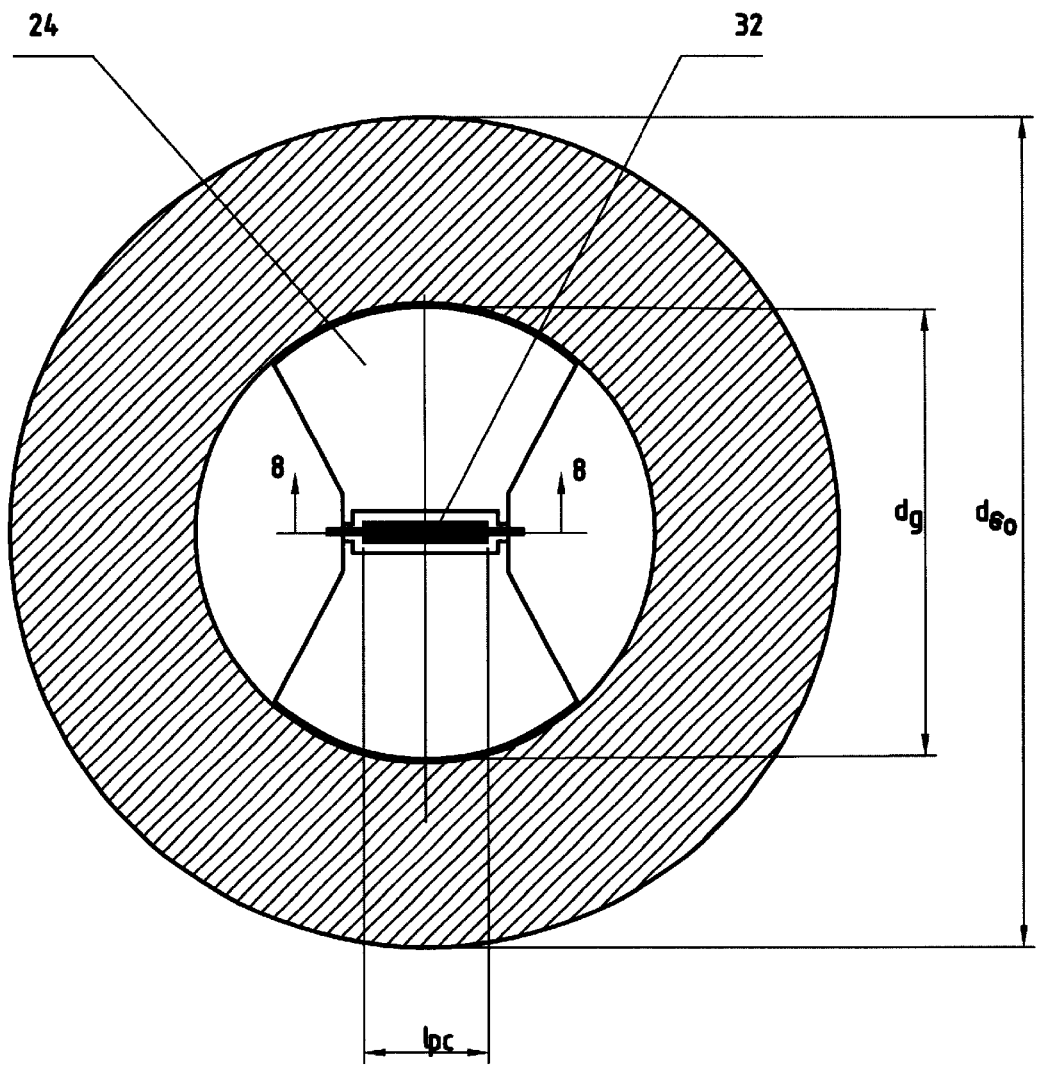
FIG. 7 is a section along the line 7—7 of FIG. 1. showing the sensor positioned on the axial center line of the dielectric column.
Figure 8:
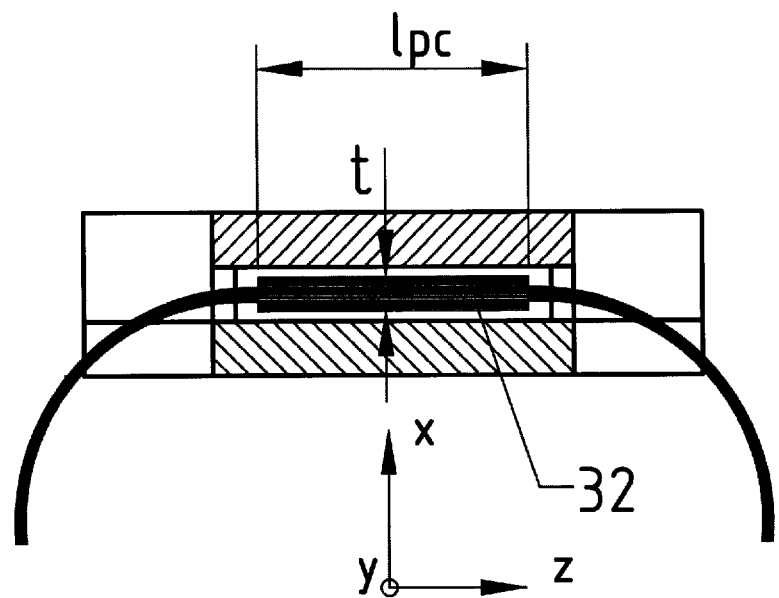
FIG. 8 is a section through the sensor (e.g. an integrated optics Pockels cell) along the line 8—8 of FIG. 7
Figure 9:
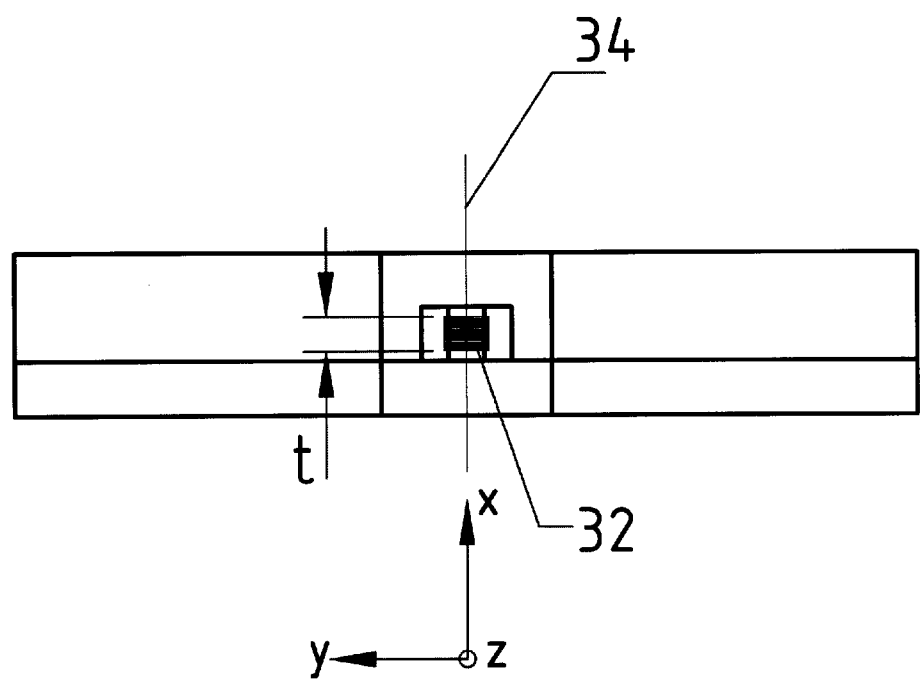
FIG. 9 is a side elevation of the sensor looking from the right in FIG. 7.

Attention is directed to FIGS. 7, 8 and 9 that show an EFS sensor such as the IOPC. The sensor holder 24 has a major diameter $d_g$ substantially equal to the inside diameter $d_i$ of the column 10 assuming the isolating column 10 is a hollow column so that the sensor holder 24 may easily be secured in position mechanically or by a suitable adhesive. The length of the IOPC 32 is indicated as $l_{pc}$ and is significantly shorter than the diameter $d_g$ and the IOPC is centered on the longitudinal axis 34 of the column 10 (see FIG. 9). The thickness of the IOPC measured along the axis 34 i.e. in the x direction is indicated as thickness t. The thickness t is short relative to the length L of the isolating section 10. The IOPC 32 is positioned so that it measures the electric field vector parallel to the axis 34 and preferably is centered on the axial centerline 34 and extends substantially perpendicular to the axis 34.

Generally a suitable point field sensor is any sensor that measures electric field in a region between two points that are very close together as compared to the distance between the two points between which the potential/voltage is to be measured. For example t=1 millimeter (mm) versus a distance between the points a and b i.e. length L of 4,000 mm is satisfactory. The ratio of L/t is typically larger than 20, but this is not an absolute minimum. Normally the collective length of the voltage sensor elements will not exceed 10% of the length L and preferably will not exceed 2% of length L between the conductors 16 and 30.

The sensor preferably should have the additional property that it does not significantly disturb the electric field distribution by its presence, or if it does, it should do so in a well known manner). For this reason, typically sensors having large conductive elements cannot be used. Small dielectric field sensors that are connected to optical fibers (or using free space optical connection) are possible examples. A more specific example is a miniaturized bulk Pockels cell device having a very thin electro-optic crystal. As above indicated, the IOPC (integrated optics Pockels cell), described in the above Jaeger patent, is the most practical solution known by the Applicants to be available at this point in time.

The considerations for using this type of transducer will now be described.

Design Concepts for EFS Voltage Transducers

The output of an integrated optics Pockels cell (IOPC) is a measure of the intensity of the component of the electric field that is directed vertically through the Pockels cell see for example N. A. F. Jaeger and F. Rahmatian, "Integrated Optics Pockels Cell High-Voltage Sensor," IEEE Trans. on Power Delivery, vol. 10, no. 1, pp. 127–134, January 1995. It is desired to use this sensory ability to measure the voltage (magnitude and phase) between points a and b; for example, line-to-ground voltage amplitude and phase on a power line connected to the top 16 when the stand 12 and plate 30 (point a) is grounded.

More explicitly, since the electric fields induced by charged electrodes are directly related to the potentials on the electrodes, it is plausible to use one or more electric field sensors, in this case preferably IOPCs, at one or more points in space within the isolating section 10 to extrapolate the voltage of the source electrode (point b) relative to the reference electrode (point a).

The following sections describe two independent design concepts that may be used with the present invention, namely, dielectric shielding (DS) and the quadrature method (QM), and that when combined improve the accuracy when using EFSs to measure voltage in power system applications.

DS is a physical affect and is used in the design of the column 10 to (1) Provide shielding of the electric field inside the column 10 from the electrical effects, voltages, and fields outside the column 10, (2) grade the electric field inside the column to produce more uniform electric field distribution and, therefore, to allow for improved accuracy in measuring voltage.

Two additional advantages of DS with high-permittivity (discussed below) material are as follows:

(3) field moderating effect, i.e., the high-stress points at the top 16 and bottom 30 of the column 10 are reduced to lower stresses i.e. the structure of the field is changed as above described with reference to FIG. 6 to produce a more uniform field distribution.

(4) the electric field near the center of the isolating column increases as the permittivity of the high-permittivity column 10 increases, and, therefore, the IOPCs or other field sensors near the center of the column require less sensitivity, i.e., there exists enough signal (electric field) amplitude to be measured by the sensor.

Having said all this, the DS may be minimal depending on the accuracy required, i.e., the relative permittivity $\in_1$ of the high-permittivity material can be as low as 1. In other words, the high-permittivity material can be air or free-space (not observable), and the device can still be effective (especially if many IOPC sensors are used inside the column 10). On the other hand, the high permittivity material may need to have very high relative permittivity value $\in_1$, such as several 1000 s (e.g., barium titanate) for high accuracy and very strong shielding. For a practical column we are considering relative permittivity values from 2 to 100, preferably greater than 20.

The QM is a mathematical technique that allows for significant improvement in accuracy for a given number of EFSs. There are, possibly, many other mathematical techniques that are useful. Some are in essence the same as the QM, but have different names. Some are different in their methodology but result in the same thing: improvement in accuracy. The purpose of using a QM is to determine optimal or nearly optimal positions for the EFS(s) in isolating section 10, and to determine an algorithm for combining the measured values of the electric field(s) at the locations of the EFS(s) so that the voltage measurement obtained using said combination algorithm is sufficiently and/or highly accurate, regardless of the presence of certain external influences disturbing the electric field distribution in the isolating section 10.

It should be noted that the QM can improve the accuracy of the measurement, and the result is to a degree DS dependent as DS affects the $w_i$ (weighting factor) and the $x_i$ distance between the lower plate 30 and the specific sensor being positioned (See equation 5) due to the effect of DS on the electric field distribution. QM is preferably used to determine the optimal locations for the EFSs to be mounted inside the column 10, and in this way QM affects the physical structure of column (including EFSs) 10.

It will be apparent that depending on the degree of accuracy required the positioning of the sensors may be varied relative to the optimum position determined by the QM i.e. provided the required accuracy is still attained. Other examples of techniques that may be found to be suitable for finding weighting factor $w_i$ and distance $x_i$ include "Numerical Quadrature" or "Formulas for Definite Integrals" or "Integration Formulas" as follows: Gauss quadrature formulas described herein, Cotes formulas (equidistance sample points), Chebyshev formulas (equal weights) and others based on choosing restraints on weights (e.g. Gregory formula) and/or sample point positions.

The concept is to use a mathematical combination of the value of electric field E for each sensor so that for any given value of said voltage difference being determined any practical disturbance in electric field influencing the measured value(s) E does not significantly change the measured value V of voltage difference.

Field modeling using numerical methods is used to demonstrate the effectiveness of the techniques.

Dielectric Shielding (DS)

For a given system of conductors in space, all with imposed electric potentials, there exists a unique electric field in the space surrounding the conductors; this is known as the uniqueness theorem (see J. A. Kong, Electromagnetic Wave Theory, New York, N.Y.: John Wiley and Sons, 2nd Ed. 1990 for details). Qualitatively speaking, although the electric field in the neighborhood of one conductor is more influenced by the voltage on that conductor than the voltages on the other conductors, the electric field changes for any change in voltage on any conductor in the system. By the equivalence principle (see also J. A. Kong, Electromagnetic Wave Theory, New York, N.Y.: John Wiley and Sons, 2nd Ed. 1990 for details), the same phenomenon can be expressed in terms of free charges on the surfaces of the conductors that redistribute themselves with any change in voltage on one or more of the conductors. Since each charge in space interacts with every other charge in space by way of its electric field, as governed by Coulomb's law, it is clear that there exists mutual field coupling among all the conductors. Since the electric field at any point in space is a function of the voltages applied to all the conductors that exist in space, the output of an EFS e.g. IOPC is a function of all these voltages. For the EFS output to be a measure of only one voltage difference (between a pair of conductors), the electric field at the point in space where the EFS is located has to be properly shielded from all other voltages on other conductors The system may be used to measure any reasonable voltage e.g. voltages from 0.001 volts to 1,000,000 volts and higher. The economic (and safety) benefits, i.e. practical range of usage, will be at higher voltages in the several thousand-volt ranges.

Using the invention with the intention of measuring the voltage on a HV transmission line, IOPCs could be used as the sensors by being placed somewhere in a standoff structure 11 attached to the transmission line. A standoff 11 is as above described made up of, from top to bottom, a conducting cap 16, an insulating column or isolating section 10, and a conducting bottom 30 and typically a conducting electrical ground column or stand 12. The output of each IOPC is used to deduce the voltage on the transmission line. Since the IOPC output depends on the electric field, as described previously, the standoff structures must be modified in such a way so as to reduce the mutual coupling effects of other HV transmission lines and any other structures in the vicinity.

Three parameters can be varied to improve isolation and reduce external coupling effects in this region:

(1) distance L between cap 16 and the plate 30,
(2) the relative permittivity $\in_1$ of the isolating section 10,
(3) the thickness d of the (high-permittivity) column or tube 10.

Generally the closer the cap 16 to plate 30 i.e. the shorter the length L of the column 10 between points a and b (see FIGS. 1 and 2), the higher the electric field intensity is between the two points a and b, and the less the electric field between the two varies due to external sources. Also, generally the higher the relative permittivity $\in_1$, of the isolating section or column (or tube) 10 and/or the greater the thickness d of the layer of the high permittivity material interposed between the sensor 14 and the ambient atmosphere the less the electric field inside the column 10 varies due to external sources. The length L of the column, the relative permittivity $\in_1$ of the shielding material, and the thickness d of the dielectric shield are all related and their choice depends on the accuracy and safety requirements for the voltage sensor.

The proper design procedure involves modeling the voltage sensor column, considering the restrictions provided under various relevant standards (such as those mentioned above), considering the accuracy requirements, and considering the availability of high-permittivity materials, their permittivity, weight, and cost to provide an economical, accurate (for the intended application), and safe voltage sensor.

The Quadrature Method (QM)

By studying the vertical electric field distribution along the center of the insulating column using computer modeling, it was observed that there exists a point along the axial centerline 100 of the isolating section 10 of an energized stand-off structure 11 that exhibits minimal variation in the vertical component of the electric field due to external interference. Such a point would be the optimal point at which to place an EFS for the purpose of accurately measuring the line-to-ground voltage on high-voltage transmission lines. This observation along with experience in the field of numerical analysis led to a mathematical explanation of the phenomena and a clear-cut procedure for the design of an EFS Voltage Transformer (EFSVT).

The EFSVT is a different sensor structure. EFS measures electric field. ESFVT uses field measurements of one or many EFSs (such as IOPC(s)) and also the geometry and material specifications of the structure 10 and calculates the voltage between two points.

Thus an EFSVT design consists of one or more EFSs, depending on measurement accuracy requirements, and relies on a suitable method, e.g. a Gaussian guadrature method, to determine the positions $x_i$ of (distance from plate 30) and weights $w_i$ or $\alpha_i$ on the outputs of the EFSs, which are preferably positioned along or close to the axial centerline of the column 10 (see equations 3, 4 and 5 below).

The positioning $x_i$ and weighting $w_i$, are optimal in the context of polynomial approximations and both theory and design procedures are described.

Theory

It is desired to express the voltage between two electrodes in terms of the electric field at a finite number of points in space. From electrostatics, the relationship between potential difference, or voltage $V_{ba}$, and electric field E is given by the following integral equation:

$$V_{ba} = \int_{\Gamma_{ab}} \vec{E} \cdot \vec{d}l$$

where the path of integration $\Gamma_{ab}$ is any path in space from a to b.

The case of the shortest path, i.e., the path along a straight line, between a and b is examined, and equation (1) above simplifies to $$V_{ba} = -\int_a^b E_x \, dx \tag{2}$$

where a and b are taken to be along the x-axis, and $E_x$ is the component of the electric field E parallel to the x-axis and is a function of x.

Through the use of (2), the problem can be posed mathematically as $$V_{ba} = -\int_a^b E_x(x) \, dx = -\sum_{i=1}^n \alpha_i E_x(x_i) \tag{3}$$

where weights $\alpha_i$ and abscissas $x_i$ are to be determined, and $E_x(x_i)$ is the x-component of the electric field at point $x_i$.

For determining the voltage $V_{ba}$ between two electrodes, a is taken to be a point on conducting plate 30, electrode A, and b is taken to be a point on the conducting plate 16, electrode B (in FIG. 2 the points a and b where a is connected to ground column 12 and b is connected to high-voltage transmission line 18). The unperturbed system is arbitrarily defined as any practical system preferably including geometry and material properties of the voltage sensor. For the unperturbed system, the electrodes produce a unique electric field, the unperturbed electric field $E^{up}(x, y, z)$. The x-component of this electric field along the x-axis is written as $$E_x^{up}(x,0,0) = E_x^{up}(x)$$

where the origin is taken as coincident with point a.

Now, a perturbed system is defined as any system that is a variation of the unperturbed system. Examples of a variation include the introduction of other voltage sources in space and inhomogeneities in the medium. The resulting electric field for such a system is the perturbed electric field $E^p(x,y,z)$. The x-component of this electric field along the x-axis is written as $$E_x^p(x,0,0) = E_x^p(x)$$

$E_x^p(x)$ can be expressed in terms of $E_x^{up}(x)$:

$$E_x^p(x) = E_x^{up}(x)\rho(x) \tag{4}$$

where $\rho(x)$ is referred to as the variation in $E_x(x)$ when going from the unperturbed to the perturbed system.

Substituting (4) into (3) and modifying the right-hand side gives $$V = -\int_a^b E_x^{up}(x)\rho(x) \, dx = -\sum_{i=1}^n w_i \rho(x_i) \tag{5}$$

where the integral is now expressed in terms of the variation $\rho(x)$ at n points along the x-axis, and where $$w_i = \alpha_i E_x^{up}(x_i)$$

As outlined in R. W. Hamming, Numerical Methods for Scientists and Engineers, New York, N.Y.: McGraw-Hill, pp. 130–132, 1962 the disclosure of which is incorporated herein by reference, a simple method exists for finding $w_i$ and $x_i$ in (5), and the solution is known as Gaussian quadrature.

The following is a description of a uniform method for finding Gaussian quadrature formulas as taken from the above referred to R. W. Hamming, Numerical Methods for Scientists and Engineers Observing all mathematical conditions necessary, the general form of formula 5 is written as $$-\int_a^b E_x^{up}(x)\rho(x) \, dx = -\sum_{i=1}^n w_i \rho(x_i) \quad E_x^{up}(x) > 0 \tag{11}$$

or $$-\int_a^b E_x^{up}(x)\rho(x) \, dx = -\sum_{i=1}^n w_i \rho(x_i) \quad E_x^{up}(x) < 0 \tag{11}$$

where sample points $x_i$ and weights $w_i$ are to be determined.

First, the defining equations are set up:

$$m_0 = w_1 + w_2 + w_3 \ldots + w_n \tag{12}$$
$$m_1 = w_1 x_1 + w_2 x_2 + w_3 x_3 \ldots + w_n x_n$$
$$m_2 = w_1 x_1^2 + w_2 x_2^2 + w_3 x_3^2 \ldots + w_n x_n^2$$
$$\vdots$$
$$m_{2n-1} = w_1 x_1^{2n-1} + w_2 x_2^{2n-1} + w_3 x_3^{2n-1} \ldots + w_n x_n^{2n-1}$$

where $m_j$ is the jth moment, which is the integral in (11) with $\rho(x) = x^j$. There is a well-known method for solving this system of nonlinear equations. We next define the sample polynomial $$\pi(x) = \prod_{i=1}^n (x - x_i) = \sum_{k=1}^n C_k x^k \tag{13}$$

Note that $\pi(x_i) = 0$ for $i = 1, 2, \ldots, n$.

We multiply the top equation in (12) by $C_0$, the next by $C_1, \ldots$, the nth by $C_n = 1$, and add to get $$\sum_{k=0}^n C_k m_k = \sum_{i=1}^n w_i \pi(x_i) = 0$$

We now shift each coefficient down one equation and repeat the process to obtain $$\sum_{k=0}^n C_k m_{k+1} = \sum_{i=1}^n w_i x_i \pi(x_i) = 0$$

If we do this a total of n times, we have $$\sum_{k=0}^{n} C_k m_{k+j} = 0 \quad (14)$$

$$(j = 0, 1, \ldots, n-1)$$

If $|m_{k+j}| \neq 0$, we can solve for the $C_k$ (using $C_n=1$). From the $C_k$, which are the coefficients of the sample polynomial (13), we can find the zeros of $\pi(x)$ which are the sample points $x_i$. Finally, we find the weights $w_i$ by solving the first n of the defining equations (12).

From the defining equations (12), it can be seen that the resulting Gaussian quadrature formula (11) is satisfied exactly if $\rho(x)$ is any polynomial of degree $2n-1$ or less. To reiterate, using Gaussian quadrature here we have effectively used a polynomial of degree $2n-1$ to estimate $\rho(x)$. Therefore, as long as the actual perturbation $\rho(x)$ as defined in equation (4) can be closely approximated by a polynomial of degree $2n-1$ or less, the accuracy in measurement will be high.

Now $\alpha_i$ for equation (3) can be determined using $$\alpha_i = \frac{w_i}{E_x^{up}(x_i)}$$

Also sufficiently accurate values of $\alpha_i$ and $x_i$ in general can be found by trial-and-error, even though the trial-and-error method is probably more time consuming and costly. Furthermore, other numerical integration methods i.e. other types of quadrature (other than Gaussian quadrature), may also be used for the same purpose, and the results may be accurate enough (depending on the accuracy requirements for the particular application).

EFSVT Design Procedure and Test Simulations

Given a high-voltage standoff with one or more IOPCs or EFS(s) placed along the center of the column, the positions of these sensors could be determined and the outputs of these sensors could be weighted as dictated by the quadrature method to obtain a very good approximation of the voltage between the cap 16 and the bottom plate 30. This is accomplished in the following two-step procedure.

Step 1: Obtaining $E_x^{up}(x)$ Using a Model of the Unperturbed System

The modeling consists of solving Poisson's equation for the electric potential $\phi(x,y,z)$ from which the electric field $E(x,y,z)$ can be computed by use of the definition $$E(x,y,z) = -\nabla \phi(x,y,z)$$

The solution of Poisson's equation $$\nabla \cdot \in \nabla \phi = -\rho$$

where $\in$ is permittivity and $\rho$ is the charge density (not the function of variation described earlier), is readily found numerically, e.g., with the finite element method, for virtually any practical configuration.

Step 2: Determining the Abscissas $x_i$ and Weights $w_i$ Using Quadrature Method with $E_x^{up}(x)$ This problem, described mathematically by (5), is solved using the method described in R. W. Hamming, Numerical Methods for Scientists and Engineers, New York, N.Y.: McGraw-Hill, pp. 130–132, 1962.

In the following example, the design and performance of a simple EFSVT standoff 11 (particularly the isolating section 10 of the standoff 11) is described and evaluated by simulation. The basic unperturbed EFSVT structure is shown in FIG. 2.

The particular standoff 11 to be analyzed comprises a dielectric column 10 with inner diameter $d_i=100$ mm and outer diameter $d_o=200$ mm, relative permittivity $\in_7 = \in_2 = \in_0 = 1$ (air), and varying relative permittivity $\in_1$. For this standoff 11, a single (n=1), a double (n=2) and triple (n=3) EFS design is developed. The length and thickness of the high voltage line 18 used in this example are $L_B=40$ m and $d_B=50$ mm.

As per Step 1, the potential field $\phi(x,y,z)$ for the unperturbed system is computed with the finite element method. The x-component of the electric field along the x-axis (column center) is then easily computed with $$E_x^{up}(x, 0, 0) = \frac{d\phi^{up}(x, 0, 0)}{dx}.$$

For Step 2, $E_x^{up}(x)$ is then used to compute the optimal positions $x_i$ and weights $w_i$ (or $\alpha_i$).

Figure 3:
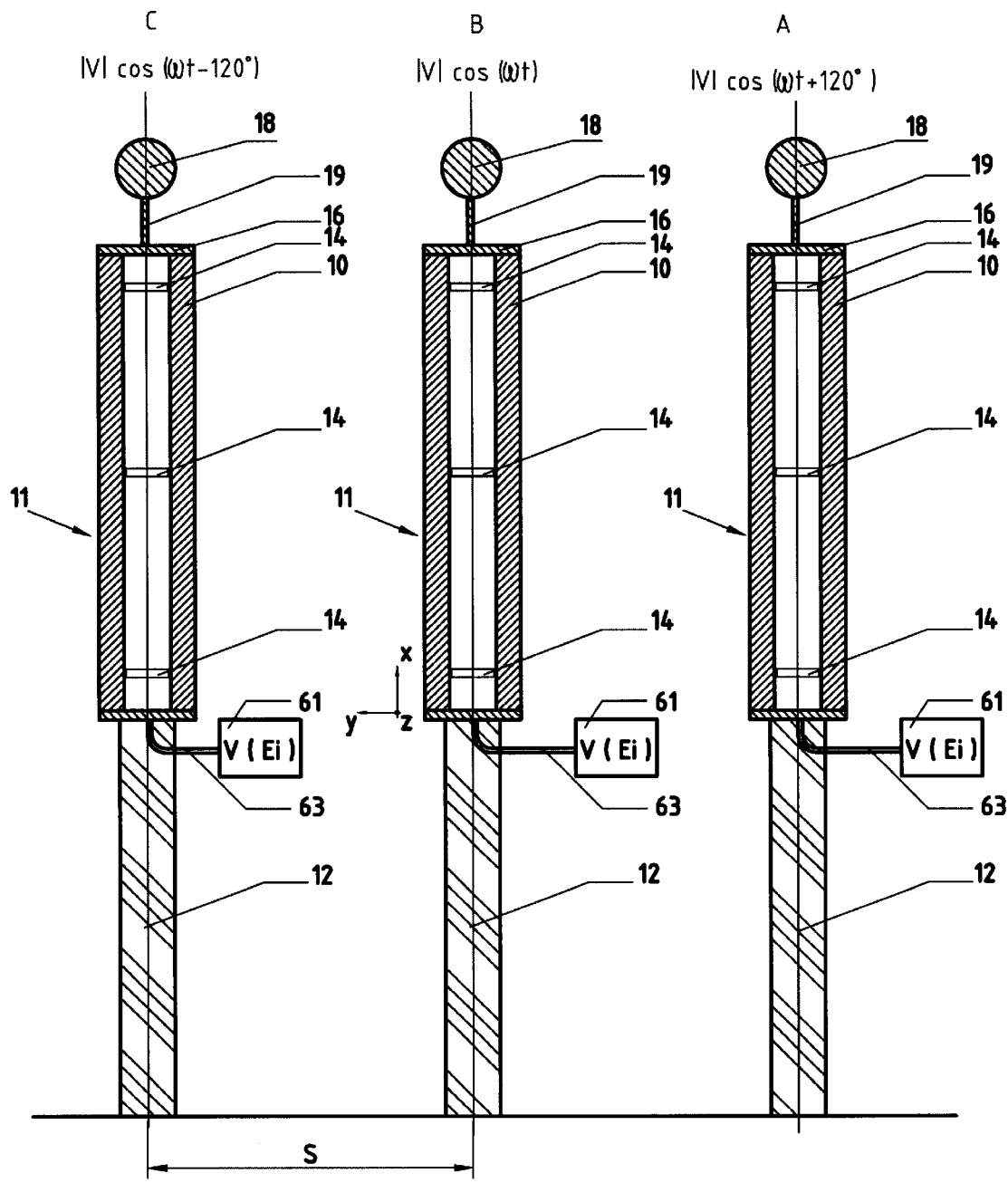
FIG. 3 shows three basic EFS VT structures each using three field sensors in a three-phase high-voltage transmission system.

Test simulations can now be set up to measure the performance of the EFSVT designs in a perturbed environment. The VT is used to measure the line-to-ground voltage on each of three buses constituting a three-phase system i.e. the perturbed system. The voltages applied to the lines are sinusoidal with a frequency of 60 Hertz, but Phase A leads Phase B by 120° and Phase B leads Phase C by 120° resulting in a balanced system as shown in FIG. 3. Phase B has been arbitrarily chosen as the reference for the phase information given in this example (see Tables 1 to 6).

In this case the voltage on a particular line can be represented by its amplitude and phase as follows:

$$V_{ba} = |V_{ba}| e^{j(\omega t + \phi_{ba})} \quad (6)$$

where $\omega$ is the angular frequency in radians per second, $|V_{ba}|$ is the voltage amplitude or magnitude, and $\phi_{ba}$ is the phase.

For a linear medium, where permittivity is not a function of potential $\phi$ (see Poisson's equation) each component of the electric field E is sinusoidal if voltage sources are sinusoidal, and E can be represented as $$E(x,y,z,t) = (|E_x(x,y,z)|e^{j\phi_x(x,y,z)}x + |E_y(x,y,z)|e^{j\phi_y(x,y,z)}y + |E_z(x,y,z)|e^{j\phi_z(x,y,z)}z)e^{j\omega t} \quad (7)$$

where $|E_i(x,y,z)|$ is the magnitude of the ith component, and $\phi_i(x,y,z)$ is the phase of the ith component of the electric field at a point (x,y,z). Since the output of the VT is simply a weighted summation of the electric fields measured, it (voltage measured) must be sinusoidal with the same frequency (60 Hertz in this example) and can be described by an amplitude and phase as well. In this particular example, the error between the actual voltage on a particular HV line and the output of the respective VT will be expressed in terms of an amplitude error and a phase error. Though in general the output of the VT gives an instantaneous reading of the voltage continuously in time. Substituting (6) and (7) into (2) gives $$V_{ba} = |V_{ba}|e^{j(\omega t+\phi_{ba})} = -\int_a^b |E_x(x, 0, 0)|e^{j\phi_x(x,0,0)} dx\, e^{j\omega t}$$

$$= \left[ -\int_a^b |E_x(x)|\cos\phi_x(x)\, dx - j\int_a^b |E_x(x)|\sin\phi_x(x)\, dx \right] e^{j\omega t}$$

$$= (I_i + jI_o)e^{j\omega t}$$

where $I_i$ and $I_o$ are integrals that represent the in-phase (real) and out-of-phase (imaginary) parts of the voltage $V_{ba}$. The magnitude and phase of $V_{ba}$ are then given by $$|V_{ba}| = \sqrt{I_i^2 + I_o^2}$$

$$\phi_{ba} = \tan^{-1}\left(\frac{I_o}{I_i}\right)$$

In practice, the outputs of each EFS are weighted and then superimposed (double-EFS and triple-EFS designs) resulting in a signal that is linearly proportional to the voltage, and subsequently the magnitude and phase of the voltage can be computed. Effectively in doing so, each of the integrals $I_i$ and $I_o$ is being approximated by the Gaussian quadrature developed earlier. Below are expressions for the quadrature approximations to the integrals for the case of a double-EFS VT design:

$$I_i = -\int_a^b |E_x(x)|\cos\phi_x(x)\,dx$$

$$= -\int_a^b E_x^{up}(x)\left[\frac{|E_x(x)|\cos\phi_x(x)}{E_x^{up}(x)}\right]dx$$

$$\approx -\left[w_1\frac{|E_x(x_1)|}{E_x^{up}(x_1)}\cos\phi_x(x_1) + w_2\frac{|E_x(x_2)|}{E_x^{up}(x_2)}\cos\phi_x(x_2)\right]$$

and similarly, $$I_o = -\int_a^b |E_x(x)|\sin\phi_x(x)\,dx$$

$$\approx -\left[w_1\frac{|E_x(x_1)|}{E_x^{up}(x_1)}\sin\phi_x(x_1) + w_2\frac{|E_x(x_2)|}{E_x^{up}(x_2)}\sin\phi_x(x_2)\right].$$

Figure 4:
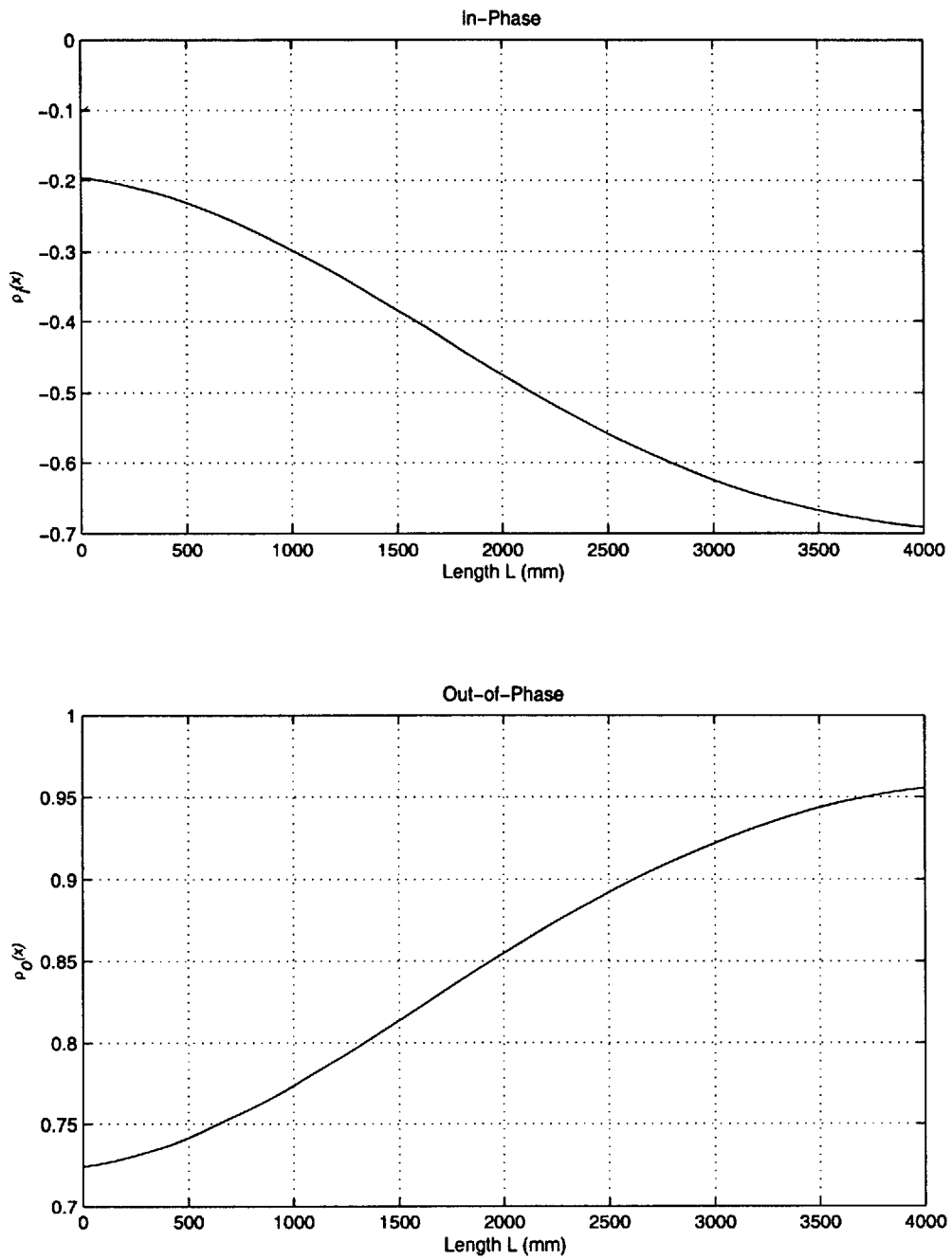
FIG. 4 shows plots of in-phase $\rho_i$ (x) and out-of-phase $\rho_o$ (x) of an example for the case of the standoff structure with $\in_1$=40 at Phase A.

According to the theory discussed above, the level of accuracy in evaluating the integrals $I_i$ and $I_o$ with Gaussian quadrature is limited only by how well the variations $$\rho_i(x) = \frac{E_x(x)}{E_x^{up}(x)}\cos(\phi_x(x))$$

and $$\rho_o(x) = \frac{E_x(x)}{E_x^{up}(x)}\sin(\phi_x(x))$$

can be approximated by a first degree polynomial in the case of the single-EFS designs, by a third degree polynomial in the case of the double-EFS designs, by a fifth degree polynomial in the case of the triple-EFS designs or in general, by 2n-1 degree polynomial in the case of the n-EFS design. FIG. 4 plots an example $\rho_i(x)$ and $\rho_o(x)$ for the case of the standoff structure with $\in_1=40$ at Phase A when t=0 (See FIG. 3 with S=6 meters).

As shown in Table 1 through Table 3, simulation results for the three-phase system demonstrate accuracies in the voltage readings for the single-, double-, and triple-EFSVT designs (S=6 m, L=4 m, $L_s$=4.3 m and $S_1$=0.3 m. see FIG. 2 for $L_s$ and $S_1$). From these tables one can observe that for every added IOPC or EFS, the accuracy in the output improves by nearly an order of magnitude. Also, as an example, the locations $x_i$ and weights $\alpha_i$ for single, double, and triple-EFS VT used in this example for the case of $\in_1=40$ are given as follows
Single EFS, $x_1$=2314.4 mm, $\alpha_1$=calibration constant
Double EFS, $x_1$=3426.3 mm, $x_2$=714.7 mm, $\alpha_1$=calibration constant, $\alpha_2/\alpha_1$=1.2940

Triple EFS, $x_1$=3681.8 mm, $x_2$=2126.5 mm, $x_3$=365.5 mm, $\alpha_1$=calibration constant, $\alpha_2/\alpha_1$=2.4845, $\alpha_3/\alpha_1$=1.14729.

Note that the calibration constants above are constants of proportionality and are determined based on the actual voltage that is to be measured on the line; in these examples here, we are looking for normalized or percentage errors and we are not concerned with the actual voltage class. Also, the percentage errors given are relative to (percentage of) the amplitude of the 60 Hz voltage signal.

TABLE 1

Single-EFSVT Simulation Results.

| $\epsilon_1$ | C | B | A |
|---|---|---|---|
| a) Amplitude Error in Percent | | | |
| 1 | 1.5111 | 2.6956 | 1.5111 |
| 10 | 2.0871 | 3.6135 | 2.0871 |
| 15 | 2.3129 | 3.9721 | 2.3129 |
| 20 | 2.4643 | 4.2104 | 2.4643 |
| 25 | 2.5540 | 4.3488 | 2.5540 |
| 30 | 2.5961 | 4.4104 | 2.5961 |
| 35 | 2.6029 | 4.4151 | 2.6029 |
| 40 | 2.5841 | 4.3786 | 2.5841 |
| 50 | 2.4974 | 4.2268 | 2.4974 |
| 60 | 2.3751 | 4.0180 | 2.3751 |
| 70 | 2.2382 | 3.7865 | 2.2382 |
| 80 | 2.0983 | 3.5509 | 2.0983 |
| 90 | 1.9616 | 3.3210 | 1.9616 |
| 100 | 1.8312 | 3.1018 | 1.8312 |
| b) Phase Error in Minutes | | | |
| 1 | 39.1425 | 0.0000 | -39.1425 |
| 10 | 51.3288 | 0.0000 | -51.3288 |
| 15 | 56.1372 | 0.0000 | -56.1372 |
| 20 | 59.3268 | 0.0000 | -59.3268 |
| 25 | 61.1699 | 0.0000 | -61.1699 |
| 30 | 61.9783 | 0.0000 | -61.9783 |
| 35 | 62.0208 | 0.0000 | -62.0208 |
| 40 | 61.5083 | 0.0000 | -61.5083 |
| 50 | 59.4161 | 0.0000 | -59.4161 |
| 60 | 56.5459 | 0.0000 | -56.5459 |
| 7a | 53.3595 | 0.0000 | -53.3595 |
| 80 | 50.1078 | 0.0000 | -50.1078 |
| 90 | 46.9260 | 0.0000 | -46.9260 |
| 100 | 43.8842 | 0.0000 | -43.8842 |

TABLE 2

Double-EFSVT Simulation Results.

| $\epsilon_1$ | C | B | A |
|---|---|---|---|
| a) Amplitude Error in Percent | | | |
| 1 | 0.0322 | 0.0602 | 0.0322 |
| 10 | -0.0904 | -0.1584 | -0.0904 |
| 15 | -0.1601 | -0.2753 | -0.1601 |
| 20 | -0.2124 | -0.3628 | -0.2124 |
| 25 | -0.2505 | -0.4261 | -0.2505 |
| 30 | -0.2771 | -0.4703 | -0.2771 |
| 35 | -0.2947 | -0.4995 | -0.2947 |
| 40 | -0.3053 | -0.5170 | -0.3053 |
| 50 | -0.3116 | -0.5269 | -0.3116 |
| 60 | -0.3051 | -0.5156 | -0.3051 |
| 70 | -0.2916 | -0.4927 | -0.2916 |
| 80 | -0.2747 | -0.4639 | -0.2747 |
| 90 | -0.2564 | -0.4329 | -0.2564 |
| 100 | -0.2379 | -0.4016 | -0.2379 |
| b) Phase Error in Minutes | | | |
| 1 | 2.4438 | 0.0000 | -2.4438 |
| 10 | -1.8024 | 0.0000 | 1.8024 |
| 15 | -3.5472 | 0.0000 | 3.5472 |
| 20 | -4.8278 | 0.0000 | 4.8278 |

TABLE 2-continued

Double-EFSVT Simulation Results.

| $\epsilon_1$ | C | B | A |
|---|---|---|---|
| 25 | −5.7524 | 0.0000 | 5.7524 |
| 30 | −6.4012 | 0.0000 | 6.4012 |
| 35 | −6.8349 | 0.0000 | 6.8349 |
| 40 | −7.1016 | 0.0000 | 7.1016 |
| 50 | −7.2762 | 0.0000 | 7.2762 |
| 60 | −7.1432 | 0.0000 | 7.1432 |
| 70 | −6.8370 | 0.0000 | 6.8370 |
| 80 | −6.4436 | 0.0000 | 6.4436 |
| 90 | −6.0131 | 0.0000 | 6.0131 |
| 100 | −5.5895 | 0.0000 | 5.5895 |

TABLE 3

Triple-EFSVT Simulation Results.

| $\epsilon_1$ | C | B | A |
|---|---|---|---|
| a) Amplitude Error in Percent | | | |
| 1 | 0.0325 | 0.0409 | 0.0325 |
| 10 | −0.0174 | −0.0318 | −0.0174 |
| 15 | −0.0105 | −0.0184 | −0.0105 |
| 20 | 0.0008 | 0.0015 | 0.0008 |
| 25 | 0.0118 | 0.0203 | 0.0118 |
| 30 | 0.0208 | 0.0356 | 0.0208 |
| 35 | 0.0275 | 0.0470 | 0.0275 |
| 40 | 0.0323 | 0.0548 | 0.0323 |
| 50 | 0.0370 | 0.0626 | 0.0370 |
| 60 | 0.0376 | 0.0635 | 0.0376 |
| 70 | 0.0360 | 0.0608 | 0.0360 |
| 80 | 0.0334 | 0.0563 | 0.0334 |
| 90 | 0.0304 | 0.0512 | 0.0304 |
| 100 | 0.0274 | 0.0460 | 0.0274 |
| b) Phase Error in Minutes | | | |
| 1 | 0.3005 | 0.0000 | −0.3005 |
| 10 | −0.6232 | 0.0000 | 0.6232 |
| 15 | −0.3720 | 0.0000 | 0.3720 |
| 20 | −0.0452 | 0.0000 | 0.0452 |
| 25 | 0.2544 | 0.0000 | −0.2544 |
| 30 | 0.4953 | 0.0000 | −0.4953 |
| 35 | 0.6744 | 0.0000 | −0.6744 |
| 40 | 0.7991 | 0.0000 | −0.7991 |
| 50 | 0.9260 | 0.0000 | −0.9260 |
| 60 | 0.9475 | 0.0000 | −0.9475 |
| 70 | 0.9123 | 0.0000 | −0.9123 |
| 80 | 0.8499 | 0.0000 | −0.8499 |
| 90 | 0.7769 | 0.0000 | −0.7769 |
| 100 | 0.7024 | 0.0000 | −0.7024 |

Figure 5:
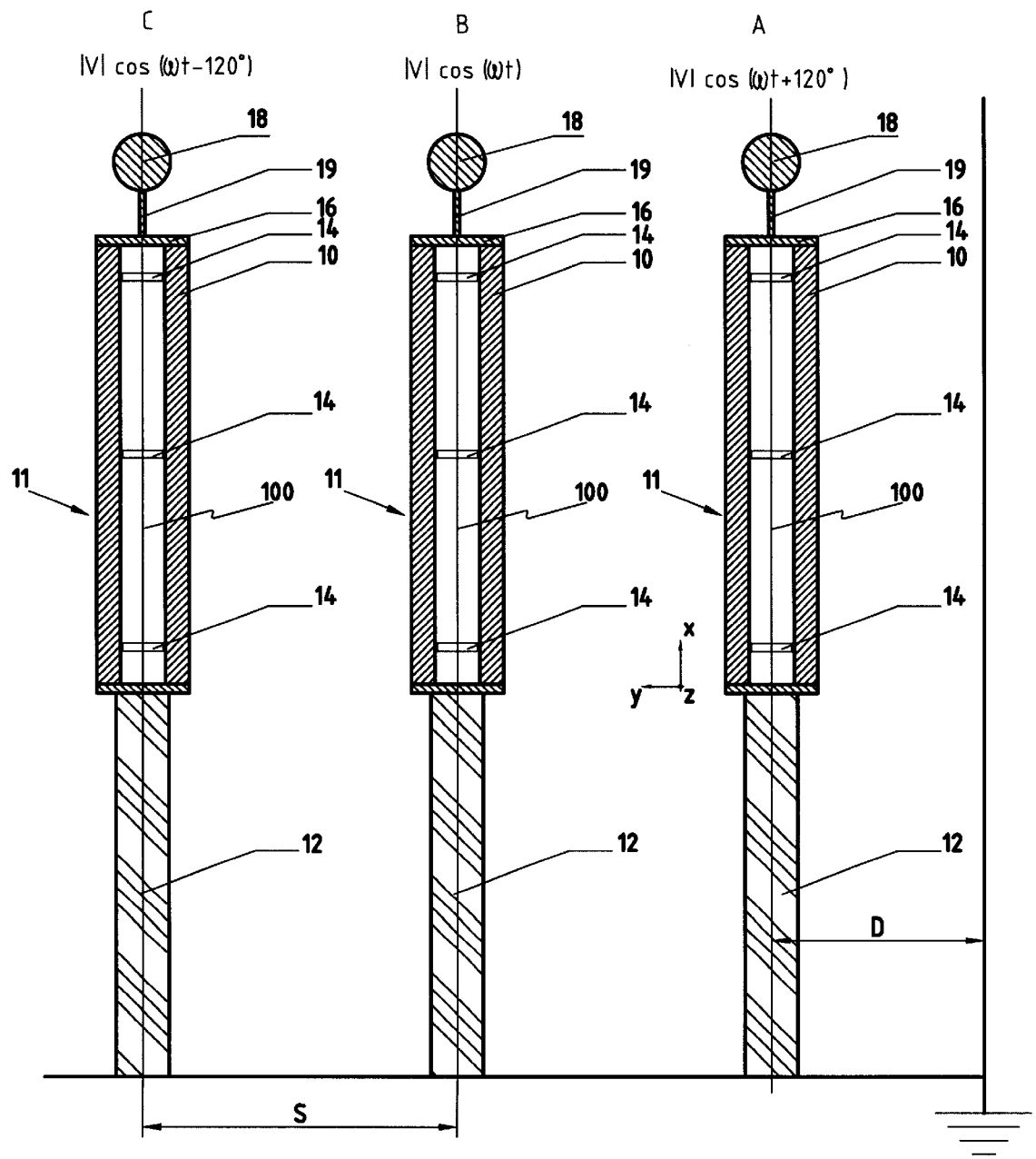
FIG. 5 is similar to FIG. 3 but further schematically illustrating an arrangement wherein a vertical semi-infinite ground plane is placed spaced from Phase A of a three-phase transmission system (by a distance of one meter in this example).

Another test simulation is set up to evaluate the performance of the VT's when a vertical semi-infinite ground plane is placed one meter away from Phase A as shown in FIG. 5 (D= 1 m). This is an example of a very perturbed system and an extreme as well as unlikely scenario in practice. Table 4 through Table 6 show results, which again demonstrate high accuracies in the voltage readings for the EFS VT designs. As is expected, the highest errors occur in the Phase A readings since introduction of the ground plane affects the field around Phase A the most.

TABLE 4

Single-EFSVT Simulation Results with Vertical Ground Plane.

| $\epsilon_1$ | C | B | A |
|---|---|---|---|
| a) Amplitude Error in Percent | | | |
| 1 | 1.5413 | 2.2077 | −21.2943 |
| 10 | 2.0493 | 3.0865 | −14.9749 |
| 15 | 2.2476 | 3.4320 | −12.1555 |
| 20 | 2.3788 | 3.6653 | −9.8643 |
| 25 | 2.4543 | 3.8052 | −8.0292 |
| 30 | 2.4869 | 3.8733 | −6.5653 |
| 35 | 2.4677 | 3.8879 | −5.3967 |
| 40 | 2.4655 | 3.8638 | −4.4611 |
| 50 | 2.3775 | 3.7405 | −3.1036 |
| 60 | 2.2579 | 3.5623 | −2.2163 |
| 70 | 2.1261 | 3.3611 | −1.6314 |
| 80 | 1.9924 | 3.1546 | −1.2452 |
| 90 | 1.8623 | 2.9519 | −0.9920 |
| 100 | 1.7385 | 2.7581 | −0.8289 |
| b) Phase Error in Minutes | | | |
| 1 | 40.2589 | −37.5817 | 33.0870 |
| 10 | 54.6579 | −42.3823 | 13.9268 |
| 15 | 60.3520 | −44.0963 | 6.5832 |
| 20 | 64.1736 | −44.9954 | 1.1666 |
| 25 | 66.4385 | −45.2261 | −2.7843 |
| 30 | 67.5062 | −44.9556 | −5.6519 |
| 35 | 67.6863 | −44.3266 | −7.7231 |
| 40 | 67.2218 | −43.4492 | −9.2065 |
| 50 | 65.0481 | −41.2560 | −10.9708 |
| 60 | 61.9590 | −38.8000 | −11.7232 |
| 70 | 58.4877 | −36.3029 | −11.8890 |
| 80 | 54.9251 | −33.8772 | −11.7108 |
| 90 | 51.4282 | −31.5775 | −11.3318 |
| 100 | 48.0791 | −29.4271 | −10.8392 |

TABLE 5

Double-EFSVT Simulation Results with Vertical Ground Plane.

| $\epsilon_1$ | C | B | A |
|---|---|---|---|
| a) Amplitude Error in Percent | | | |
| 1 | 0.0285 | 0.0818 | 3.7044 |
| 10 | −0.0944 | −0.1134 | 3.4582 |
| 15 | −0.1588 | −0.2211 | 2.9869 |
| 20 | −0.2067 | −0.3025 | 2.5525 |
| 25 | −0.2412 | −0.3619 | 2.1749 |
| 30 | −0.2652 | −0.4040 | 1.8539 |
| 35 | −0.2809 | −0.4322 | 1.5837 |
| 40 | −0.2901 | −0.4497 | 1.3575 |
| 50 | −0.2949 | −0.4615 | 1.0107 |
| 60 | −0.2881 | −0.4535 | 0.7682 |
| 70 | −0.2751 | −0.4346 | 0.5978 |
| 80 | −0.2588 | −0.4100 | 0.4772 |
| 90 | −0.2414 | −0.3831 | 0.3914 |
| 100 | −0.2239 | −0.3557 | 0.3300 |
| b) Phase Error in Minutes | | | |
| 1 | 2.5238 | 1.2904 | −7.6808 |
| 10 | −1.9091 | 3.6339 | −5.5340 |
| 15 | −3.8444 | 4.5069 | −4.2753 |
| 20 | −5.2756 | 5.0895 | −3.2177 |
| 25 | −6.3133 | 5.4645 | −2.3506 |
| 30 | −7.0440 | 5.6869 | −1.6454 |
| 35 | −7.5348 | 5.7953 | −1.0741 |
| 40 | −7.8383 | 5.8181 | −0.6181 |
| 50 | −8.0430 | 5.7173 | 0.0314 |
| 60 | −7.9028 | 5.4504 | 0.4303 |
| 70 | −7.5699 | 5.1134 | 0.6630 |
| 80 | −7.1378 | 4.7543 | 0.7857 |
| 90 | −6.6605 | 4.3966 | 0.8379 |
| 100 | −6.1773 | 4.0516 | 0.8507 |

TABLE 6

Triple-EFS T Simulation Results with Vertical Ground Plane.

| $\epsilon_1$ | C | B | A |
|---|---|---|---|
| a) Amplitude Error in Percent | | | |
| 1 | 0.0232 | 0.0439 | 0.6500 |
| 10 | −0.0186 | −0.0287 | −0.1115 |
| 15 | −0.0110 | −0.0177 | −0.2181 |
| 20 | 0.0002 | −0.0003 | −0.2394 |
| 25 | 0.0107 | 0.0166 | −0.2232 |
| 30 | 0.0193 | 0.0304 | −0.1929 |
| 35 | 0.0257 | 0.0408 | −0.1595 |
| 40 | 0.0301 | 0.0481 | −0.1280 |
| 50 | 0.0345 | 0.0554 | −0.0764 |
| 60 | 0.0350 | 0.0565 | −0.0405 |
| 70 | 0.0336 | 0.0542 | −0.0168 |
| 80 | 0.0311 | 0.0504 | −0.0016 |
| 90 | 0.0283 | 0.0458 | 0.0078 |
| 100 | 0.0255 | 0.0412 | 0.0135 |
| b) Phase Error in Minutes | | | |
| 1 | 0.5482 | −0.1278 | −0.6569 |
| 10 | −0.6161 | 0.3061 | 0.6566 |
| 15 | −0.3716 | 0.1152 | 0.7018 |
| 20 | −0.0277 | −0.0987 | 0.6061 |
| 25 | 0.2946 | −0.2827 | 0.4696 |
| 30 | 0.5561 | −0.4239 | 0.3299 |
| 35 | 0.7516 | −0.5242 | 0.2072 |
| 40 | 0.8883 | −0.5902 | 0.1058 |
| 50 | 1.0277 | −0.6473 | −0.0332 |
| 60 | 1.0512 | −0.6438 | −0.1150 |
| 70 | 1.0124 | −0.6107 | −0.1571 |
| 80 | 0.9434 | −0.5621 | −0.1756 |
| 90 | 0.8626 | −0.4928 | −0.1799 |
| 100 | 0.7801 | −0.4407 | −0.1761 |

Comparison of Tables 1, 2, and 3 and comparison of Tables 4, 5, and 6 show that increasing the number of EFS improves accuracy. However, the beneficial effects of dielectric shielding are not as apparent. Perhaps the effect of dielectric shielding on accuracy is best seen on column A of Tables, 4, 5, and 6 where a severe disturbance next to phase A affects field distribution in that region. The improvement in amplitude accuracy for phase A VT as a function of relative permittivity $\in_1$ for a single-EFS system is clearly shown in Table 4.

In the discussed VT designs, it was assumed that an EFS e.g. an IOPC, can be positioned exactly at any location inside the dielectric column and that the EFS itself does not affect the electric field in which it is placed. In reality, the EFS may have to be mounted on a flange or other small section of either insulating or conducting material, which in turn can then be mounted inside the dielectric column during construction. Such a structure may significantly alter the electric field that would otherwise exist in the column, thereby making the problem of finding the Gaussian quadrature points a more complex one. In this case, (5) becomes $$V = -\int_a^b E_x^{up}(x, x_1, x_2, \ldots, x_n)\rho(x)\,dx = -\sum_{i=1}^n w_i \rho(x_i) \quad (8)$$

where $E_x^{up}(x)$ is now also a function of the location of the sensors. It is believed that this equation is solvable by an iterative technique in which Step 1 and Step 2 are repeated until a consistent solution is reached. This can also be verified through simulation.

For an unperturbed system, i.e., $\rho(x)=1$, (5) is exact. If the positioning of an IOPC with respect to a sample point m is slightly in error by a small distance $\Delta x$, the error in V, $\Delta V$ is easily formulated by way of a two-term truncated Taylor series expansion:

$$V + \Delta V = -\int_a^b E_x^{up}(x)\,dx = -\sum_{i=1}^n w_i - \frac{w_m \Delta x}{E_x^{up}(x_m)} \frac{dE_x^{up}(x_m)}{dx}$$

where $$\Delta V = -\frac{w_m \Delta x}{E_x^{up}(x_m)} \frac{dE_x^{up}(x_m)}{dx}$$

As pointed out earlier, shielding due to high dielectric constants reduces the gradient in the vertical electric field component $E_x^{up}(x)$. So, increased shielding could be used to reduce the sensitivity of the accuracy of the quadrature to an error in positioning. In practice, calibration would also be employed to minimize measurement error.

Also mentioned above was the fact that increased shielding reduces the effects of any external influences on the field inside the dielectric column. In terms of the discussion in this report, this means that increased shielding would reduce the nonlinearity in the variation $\rho(x)$ due to external influences. In other words, a lower degree polynomial could better approximate $\rho(x)$, and the quadrature would be more accurate. So, a trade-off exists between the number of EFS and the amount of shielding needed to achieve a particular accuracy in the readings of an EFS VT. This is evidenced by a comparison of the simulation results for the single-, double-, and triple-EFS VT designs (Table 4 through Table 6).

Having described the invention modifications will be evident to those skilled in the art without departing from the spirit of the invention as defined in the appended claims.

What is claimed is:

1. A method of measuring electric potential between first and second spaced apart conductors (18, 15) coupled to first and second terminals (16, 30), respectively, separated by a distance L, wherein any electric potential between said first and second terminals (16, 30) establishes an electric field distribution therebetween in relation to any electric potential between said spaced apart conductors, comprising the steps of:

spatially positioning N electric field sensors (14) between said first and second terminals (16, 30), where,
N represents an integer number of said electric field sensors (14) where said integer number $\geq 1$,
each $i^{th}$ electric field sensor (14) is spaced apart from another one of said electric field sensors and positioned at a selected distance $x_i$ away from said first terminal and along a selected path extending between said first and second terminals, and
each $i^{th}$ electric field sensor (14) provides an electric field output signal indicative of the electric field, $E_i$, thereat; and determining an electric potential value, V, representative of said electric potential between said first and second spaced apart conductors (18, 15), as a function of a weighted sum of said electric field output signal associated with each of said N electric field sensors, and said weighted sum being mathematically of the form $$V = \sum_{i=1}^N \alpha_i E_i$$

where
N is said integer number of electric field sensors $\geq 1$,
$E_i$ represents electric field measurement of the $i^{th}$ sensor at a distance $x_i$ away from said first terminal, and
$\alpha_i$ is a weighting factor associated with the $i^{th}$ electric field sensor, and
where $x_i$ and $\alpha_i$ are selected so that $$\sum_{i=1}^{N} \alpha_i dE_i$$

is substantially minimized, where $dE_i$ represents any change in $E_i$ at $x_i$ due to external electric field disturbances.

2. The method of claim 1 wherein each of said electric field sensors (14) serves as a point electric field sensor, and includes a sensing region between first and second sensing points separated by a distance W, where the ratio W/L is less than 0.1.

3. The method of claim 2 where said $x_i$ and $\alpha_i$ values are determined by a method selected from the group consisting of optimization method, quadrature method, Gaussian method, computer analysis method, computer modeling method, and mathematical modeling method.

4. The method of claim 3 wherein each of said electric field sensors (14) is an optical electric field sensor.

5. The method of claim 1 where said $x_i$ and $\alpha_i$ values are determined by a method selected from the group consisting of optimization method, quadrature method, Gaussian method, computer analysis method, computer modeling method, and mathematical modeling method.

6. The method of claim 1 wherein each of said electric field sensors (14) is an optical electric field sensor.

7. The method of claim 6 wherein said optical electric field sensor is selected from the group consisting of an integrated optic Pockels cell electric field sensor, electro-optic electric field sensor, Pockels cell electric field sensor, integrated optic electric field sensor, and fiber optic electric field sensor.

8. The method of claim 1 wherein said first and second spaced apart conductors are a pair of power lines (18) or a power line (18) and earth ground (15).

9. The method of claim 1 further including an electric field screening member (10) having a first terminating region electrically coupled to said first terminal means (16), and a second terminating region electrically coupled to said second terminal means (30), and said electric field screening member is constructed of a substantially electrically insulating material and having a selected permittivity and structural geometry for substantially isolating said N electric field sensors from external electric field disturbances so as to reduce any error in said electric potential value, V, resulting from said external electric field disturbances.

10. The method of claim 9 wherein said electric field screening member is tubularly shaped forming an internal isolation chamber, and wherein said N electric field sensors are positioned within said internal isolation chamber.

11. The method of claim 10 wherein:
a generally tubular insulator column constructed of a generally electrically insulating material is adapted for supporting said first and second terminals; and
said electric field screening member and said electric field sensors are positioned within said insulator column.

12. The method of claim 9 wherein:
a generally tubular insulator column constructed of a generally electrically insulating material is adapted for supporting said first and second terminals; and
said electric field screening member and said electric field sensors are positioned within said insulator column.

13. An apparatus for measuring electric potential between first and second spaced apart conductors (18, 15), wherein, comprising:
a standoff structure (11) having,
a first terminal means (16, 19) adapted to be electrically coupled to said first conductor (18),
a second terminal means (30) adapted to be electrically coupled to said second conductor (12,15), where said first and second terminals are separated by a distance L, and
wherein any electric potential between said first and second terminals (16, 30) establishes an electric field distribution therebetween in relation to any electric potential between said spaced apart conductors;
N electric field sensors (14) between said first and second terminals (16, 30), where,
N represents an integer number of said electric field sensors where said integer number $\geq 1$,
each $i^{th}$ electric field sensor is spaced apart from another one of said electric field sensors and positioned at a selected distance $x_i$ away from said first terminal and along a selected path extending between said first and second terminals, and
each $i^{th}$ electric field sensor (14) provides an electric field output signal indicative of the electric field, $E_i$, thereat;
means (61) for determining an electric potential value, V, representative of said electric potential between said first and second spaced apart conductors (18, 15), as a function of a weighted sum of said electric field output signal associated with each of said N electric field sensors, and said weighted sum being mathematically of the form $$V = \sum_{i=1}^{N} \alpha_i E_i$$

where
N represents an integer number of said electric field sensors where said integer number $\geq 1$,
$E_i$ represents electric field measurement of the $i^{th}$ sensor at a distance $x_i$ away from said first terminal, and
$\alpha_i$ is a weighting factor associated with the $i^{th}$ electric field sensor, and
where values of $x_i$ and $\alpha_i$ are selected so that $$\sum_{i=1}^{N} \alpha_i dE_i$$

is substantially minimized, where $dE_i$ represents any change in $E_i$ at $x_i$ due to external electric field disturbances.

14. The apparatus of claim 13 wherein each of said electric field sensors (14) serves as a point electric field sensor, and includes a sensing region between first and second sensing points separated by a distance W, where the ratio W/L is less than 0.1.

15. The apparatus of claim 14 where said $x_i$ and $\alpha_i$ values are determined by a method selected from the group consisting of optimization method, quadrature method, Gaussian method, computer analysis method, computer modeling method, and mathematical modeling method.

16. The apparatus of claim 15 wherein each of said electric field sensors (14) is an optical electric field sensor.

17. The apparatus of claim 13 where said $x_i$ and $\alpha_i$ values are determined by a method selected from the group consisting of optimization method, quadrature method, Gaussian method, computer analysis method, computer modeling method, and mathematical modeling method.

18. The apparatus of claim 13 wherein each of said electric field sensors (14) is an optical electric field sensor.

19. The apparatus of claim 18 wherein said optical electric field sensor is selected from the group consisting of an integrated optic Pockels cell electric field sensor, electro-optic electric field sensor, Pockels cell electric field sensor, integrated optic electric field sensor, and fiber optic electric field sensor.

20. The apparatus as defined in claim 13 wherein said first and second spaced apart conductors are a pair of power lines (18) or a power line (18) and earth ground (15).

21. The apparatus as defined in claim 13 further comprising an electric field screening member (10) having a first terminating region electrically coupled to said first terminal means (16), and a second terminating region electrically coupled to said second terminal means (30), and said electric field screening member is constructed of a substantially electrically insulating material and having a selected permittivity and structural geometry for substantially isolating said N electric field sensors from external electric field disturbances so as to reduce any error in said electric potential value, V, resulting from said external electric field disturbances.

22. The apparatus as defined in claim 21 wherein said electric field screening member is tubularly shaped forming an internal isolation chamber, and wherein said N electric field sensors are positioned within said internal isolation chamber.

23. The apparatus of claim 22 wherein:
said standoff structure further includes a generally tubular insulator column constructed of a generally electrically insulating material adapted for supporting said first and second terminals; and
said electric field screening member and said electric field sensors are positioned within said insulator column.

24. The apparatus of claim 21 wherein:
said standoff structure further includes a generally tubular insulator column constructed of a generally electrically insulating material adapted for supporting said first and second terminals; and
said electric field screening member and said electric field sensors are positioned within said insulator column.

25. An apparatus for measuring electric potential between first and second spaced apart conductors (18, 15) comprising:
a standoff structure (11) having,
a first terminal means (16, 19) adapted to be electrically coupled to said first conductor (18),
a second terminal means (30) adapted to be electrically coupled to said second conductor (12,15), where said first and second terminals are separated by a distance L, and
wherein any electric potential between said first and second terminals (16, 30) establishes an electric field distribution therebetween in relation to any electric potential between said spaced apart conductors;
N electric field sensors (14) between said first and second terminals (16, 30), where,
N represents an integer number of said electric field sensors where said integer number $\geq 1$,
each $i^{th}$ electric field sensor is spaced apart from another one of said electric field sensors and positioned at a selected distance $x_i$ away from said first terminal and along a selected path extending between said first and second terminals, and
each $i^{th}$ electric field sensor (14) provides an electric field output signal indicative of the electric field, $E_i$, thereat;
means (61) for determining an electric potential value, V, as a function of said electric field output signal of each of said N electric field sensors (14), where said electric potential value, V, is indicative of said electric potential between said first and second conductors;
an electric field screening member (10) having a first terminating region electrically coupled to said first terminal means (16), and a second terminating region electrically coupled to said second terminal means (30), and said electric field screening member is constructed of a substantially electrically insulating material and having a selected permittivity and structural geometry for substantially isolating said N electric field sensors from external electric field disturbances so as to reduce any error in said electric potential value, V, resulting from said external electric field disturbances.

26. The apparatus of claim 25 wherein said function is a weighted sum of said electric field output signal associated with each of said N electric field sensors (14), and said weighted sum being mathematically of the form $$V = \sum_{i=1}^{N} \alpha_i E_i$$

where
N is said integer number of electric field sensors $\geq 1$,
$E_i$ represents electric field measurement of the $i^{th}$ sensor at a distance $X_i$ away from said first terminal, and
$\alpha_i$ is a weighting factor associated with the $i^{th}$ electric field sensor, and
where values of $x_i$ and $\alpha_i$ are selected so that $$\sum_{i=1}^{N} \alpha_i dE_i$$

is substantially minimized, where $dE_i$ represents any change in $E_i$ at $x_i$ due to external electric field disturbances.

27. The apparatus of claim 25 wherein each of said electric field sensors (14) serves as a point electric field sensor, and includes a sensing region between first and second sensing points separated by a distance W, where the ratio W/L is less than 0.1.

28. The apparatus of claim 26 where said $x_i$ and $\alpha_i$ values are determined by a method selected from the group consisting of optimization method, quadrature method, Gaussian method, computer analysis method, computer modeling method, and mathematical modeling method.

29. The apparatus of claim 28 wherein each of said electric field sensors (14) is an optical electric field sensor.

30. The apparatus of claim 29 wherein said optical electric field sensor is selected from the group consisting of an integrated optic Pockels cell electric field sensor, electro-optic electric field sensor, Pockels cell electric field sensor, integrated optic electric field sensor, and fiber optic electric field sensor.

31. The apparatus of claim 25 wherein each of said electric field sensors (14) is an optical electric field sensor.

32. The apparatus of claim 31 wherein said optical electric field sensor is selected from the group consisting of an integrated optic Pockels cell electric field sensor, electro-optic electric field sensor, Pockels cell electric field sensor, integrated optic electric field sensor, and fiber optic electric field sensor.

33. The apparatus of claim 25 wherein said first and second spaced apart conductors are a pair of power lines (18) or a power line (18) and earth ground (15).

34. The apparatus of claim 25 wherein said electric field screening member is tubularly shaped forming an internal isolation chamber, and wherein said at least one electric field sensor is positioned within said internal isolation chamber.

35. The apparatus of claim 34 wherein:
said standoff structure further includes a generally tubular insulator column constructed of a generally electrically insulating material adapted for supporting said first and second terminals; and
said electric field screening member and said electric field sensors are positioned within said insulator column.

36. The apparatus of claim 25 wherein:
said standoff structure further includes a generally tubular insulator column constructed of a generally electrically insulating material adapted for supporting said first and second terminals; and
said electric field screening member and said electric field sensors are positioned within said insulator column.

37. A method of measuring electric potential between first and second spaced apart conductors (18, 15) coupled to first and second terminals (16, 30), respectively, separated by a distance L, wherein any electric potential between said first and second terminals (16, 30) establishes an electric field distribution therebetween in relation to any electric potential between said spaced apart conductors, comprising the steps of:
spatially positioning N electric field sensors (14) between said first and second terminals (16, 30), where,
N represents an integer number of said electric field sensors where said integer number $\geq 1$,
each $i^{th}$ electric field sensor (14) of said N electric field sensors (14) is spaced apart from another one of said electric field sensors and positioned at a selected distance $x_i$ away from said first terminal and along a selected path extending between said first and second terminals, and
each $i^{th}$ electric field sensor (14) provides an electric field output signal indicative of the electric field, $E_i$, thereat;
determining an electric potential value, V, as a function of said electric field output signal of each of said N electric field sensors (14), where said electric potential value, V, is indicative of said electric potential between said first and second conductors; and
screening said N electric field sensors with an electric field screening member (10) having a first terminating region electrically coupled to said first terminal means (16), and a second terminating region electrically coupled to said second terminal means (30), and said electric field screening member being constructed of a substantially electrically insulating material and having a selected permittivity and structural geometry for substantially isolating said N electric field sensors from external electric field disturbances so as to reduce any error in said electric potential value, V, resulting from said external electric field disturbances.

38. The method of claim 37 wherein said function is a weighted sum of said electric field output signal associated with each of said N electric field sensors, and said function being mathematically of the form $$V = \sum_{i=1}^{N} \alpha_i E_i$$

where
N is said integer number of electric field sensors $\geq 1$,
$E_i$ represents electric field measurement of the $i^{th}$ sensor at a distance $x_i$ away from said first terminal, and
$\alpha_i$ is a weighting factor associated with the $i^{th}$ electric field sensor, and
where values of $x_i$ and $\alpha_i$ are selected so that $$\sum_{i=1}^{N} \alpha_i dE_i$$

is substantially minimized, where $dE_i$ represents any change in $E_i$ at $x_i$ due to external electric field disturbances.

39. The method of claim 37 wherein said electric field screening member is tubularly shaped forming an internal isolation chamber, and wherein said N electric field sensors are positioned within said internal isolation chamber.

40. The method of claim 39 wherein:
a generally tubular insulator column constructed of a generally electrically insulating material is adapted for supporting said first and second terminals; and
said electric field screening member and said electric field sensors are positioned within said insulator column.

41. The method of claim 37 wherein:
a generally tubular insulator column constructed of a generally electrically insulating material is adapted for supporting said first and second terminals; and
said electric field screening member and said electric field sensors are positioned within said insulator column.

42. The method of claim 38 where said $x_i$ and $\alpha_i$ values are determined by a method selected from the group consisting of optimization method, quadrature method, Gaussian method, computer analysis method, computer modeling method, and mathematical modeling method.

43. The method of claim 42 wherein each of said electric field sensors (14) is an optical electric field sensor.

44. The method of claim 37 wherein said first and second spaced apart conductors are a pair of power lines (18) or a power line (18) and earth ground (15).

45. The method of claim 37 wherein each of said electric field sensors (14) is an optical electric field sensor.

46. An apparatus for measuring power line voltage, V, selectively between a pair of power lines (18) or between a power line (18) and earth ground (15), comprising:
a standoff structure (11) having,
a generally tubular insulator column constructed of a generally electrically insulating material adapted for supporting,
a first terminal means (16, 19) adapted to be electrically coupled to said first conductor (18),
a second terminal means (30) adapted to be electrically coupled to said second conductor (12,15), where said first and second terminals are separated by a distance L, and wherein any electric potential between said first and second terminals (16, 30) establishes an electric field distribution therebetween in relation to any power line voltage between said selected pair of lines, or one power line and earth ground;

N electric field sensors (14) positioned within said tubular insulator column and between said first and second terminals (16, 30), where,
  N represents an integer number of said electric field sensors where said integer number $\geq 1$,
  each $i^{th}$ electric field sensor is spaced apart from another one of said electric field sensors and positioned at a selected distance $x_i$ away from said first terminal and along a selected path extending between said first and second terminals, and
  each $i^{th}$ electric field sensor (14) provides an electric field output signal indicative of the electric field, $E_i$, thereat;

means (61) for determining said electric potential value, V, as a function of said electric field output signal of each of said N electric field sensors (14); and an electric field screening member (10) having a first terminating region electrically coupled to said first terminal means (16), and a second terminating region electrically coupled to said second terminal means (30), and said electric field screening member is constructed of a substantially electrically insulating material and having a selected permittivity and structural geometry for substantially isolating said N electric field sensors from external electric field disturbances so as to reduce any error in said electric potential value, V, resulting from said external electric field disturbances.

47. The apparatus of claim 46 wherein said function is a weighted sum of said electric field output signal associated with each of said N electric field sensors, and said function being mathematically of the form $$V = \sum_{i=1}^{N} \alpha_i E_i$$

where
  N is said integer number of electric field sensors $\geq 1$,
  $E_i$ represents electric field measurement of the $i^{th}$ sensor at a distance $x_i$ away from said first terminal, and
  $\alpha_i$ is a weighting factor associated with the $i^{th}$ electric field sensor, and
  where values of $x_i$, $\alpha_i$, and said permittivity of said screening member are selected so that $$\sum_{i=1}^{N} \alpha_i dE_i$$

is substantially minimized, where $dE_i$ represents any change in $E_i$ at $x_i$ due to external electric field disturbances.

48. The apparatus of claim 47 wherein each of said electric field sensors (14) serves as a point electric field sensor, and includes a sensing region between first and second sensing points separated by a distance W, where the ratio W/L is less than 0.1.

49. The apparatus of claim 48 wherein each of said electric field sensors (14) is an optical electric field sensor.

50. The apparatus of claim 47 wherein each of said electric field sensors (14) is an optical electric field sensor.

51. The apparatus of claim 47 where said $x_i$ and $\alpha_i$ values are determined by a method selected from the group consisting of optimization method, quadrature method, Gaussian method, computer analysis method, computer modeling method, and mathematical modeling method.

* * * * *